(12) United States Patent
Toh et al.

(10) Patent No.: US 8,895,402 B2
(45) Date of Patent: Nov. 25, 2014

(54) FIN-TYPE MEMORY

(75) Inventors: Eng Huat Toh, Singapore (SG); Elgin Quek, Singapore (SG); Shyue Seng Tan, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 61 days.

(21) Appl. No.: 13/602,310

(22) Filed: Sep. 3, 2012

(65) Prior Publication Data
US 2014/0061576 A1   Mar. 6, 2014

(51) Int. Cl.
*H01L 21/20* (2006.01)

(52) U.S. Cl.
USPC ............................................. 438/385; 257/5

(58) Field of Classification Search
None
See application file for complete search history.

(56) References Cited

U.S. PATENT DOCUMENTS

| 7,892,936 B1* | 2/2011 | Wu et al. | 438/385 |
| 2011/0193051 A1* | 8/2011 | Nam et al. | 257/4 |

* cited by examiner

*Primary Examiner* — Whitney T Moore
*Assistant Examiner* — Joseph Galvin, III
(74) *Attorney, Agent, or Firm* — Horizon IP Pte. Ltd.

(57) ABSTRACT

Memory devices and methods for forming a device are disclosed. A substrate prepared with a lower electrode level with bottom electrodes is provided. Fin stack layers are formed on the lower electrode level. Spacers are formed on top of the fin stack layers. The spacers have a width which is less than a lithographic resolution. The fin stack layers are patterned using the spacers as a mask to form fin stacks. The fin stacks contact the bottom electrodes. An interlevel dielectric (ILD) layer is formed on the substrate. The ILD layer fills spaces around the fin stacks. An upper electrode level is formed on the ILD layer. The upper electrode level has top electrodes in contact with the fin stacks. The electrodes and fin stacks form fin-type memory cells.

21 Claims, 37 Drawing Sheets

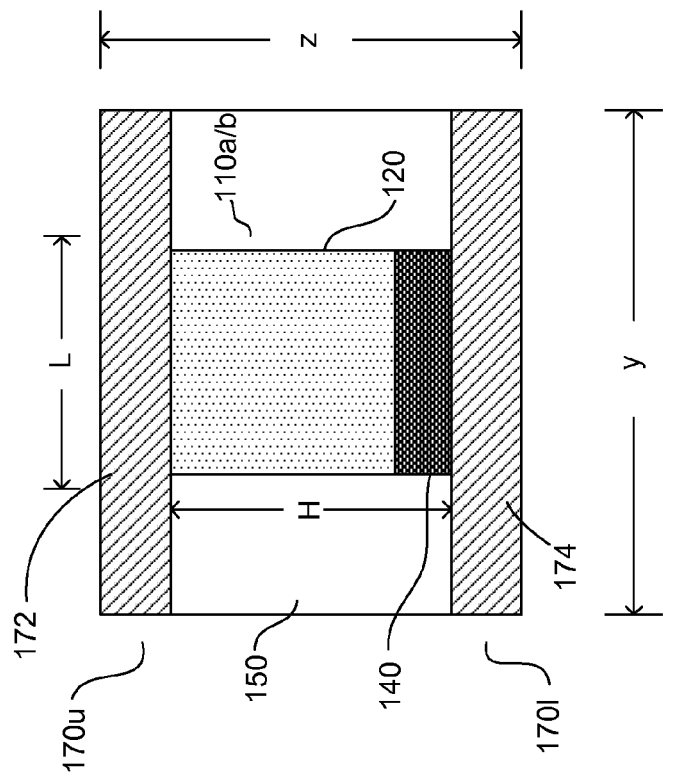
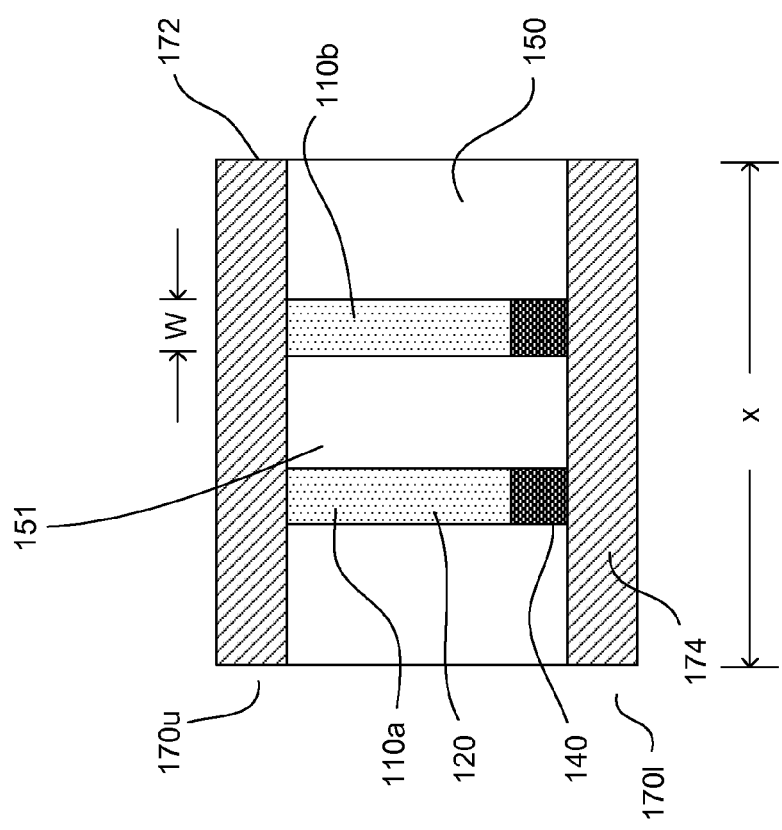

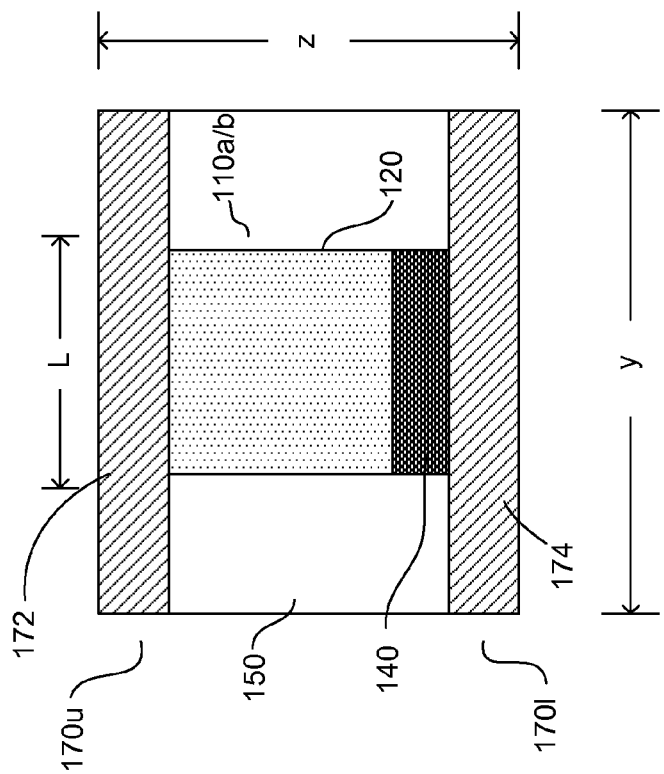
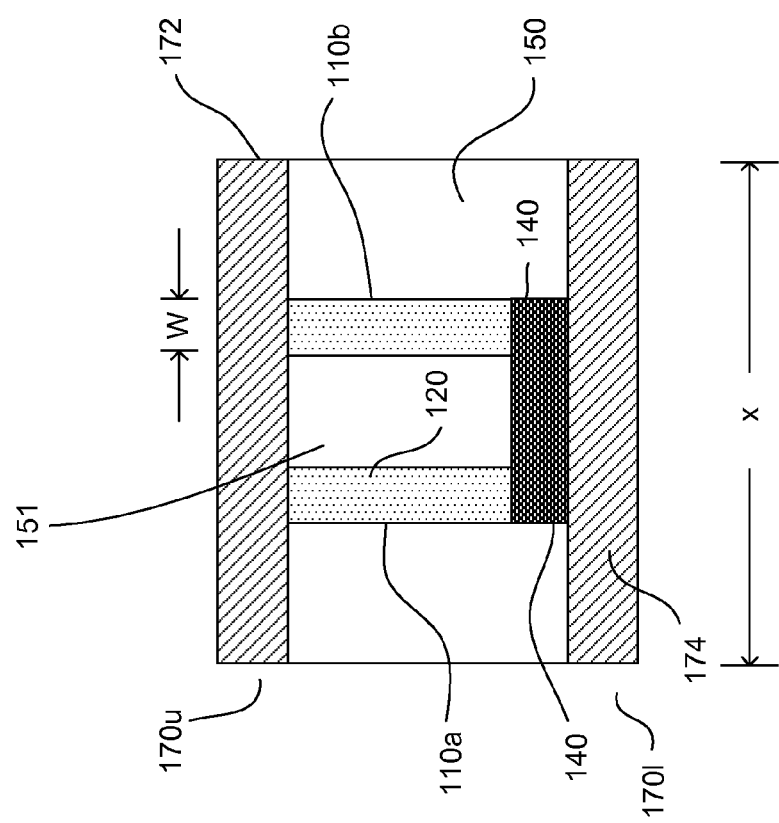
Fig. 1b₁  Fig. 1b₂

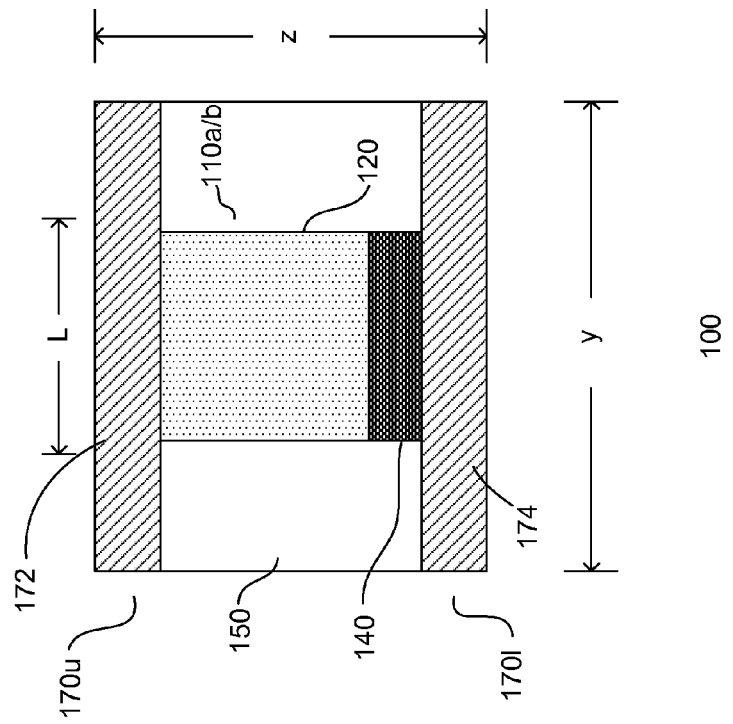
Fig. 1c₂
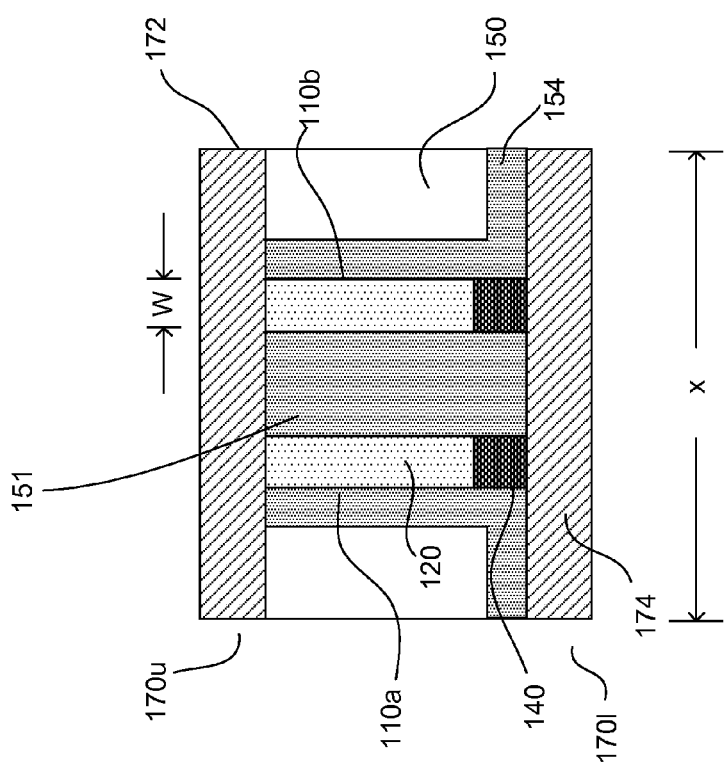
Fig. 1c₁

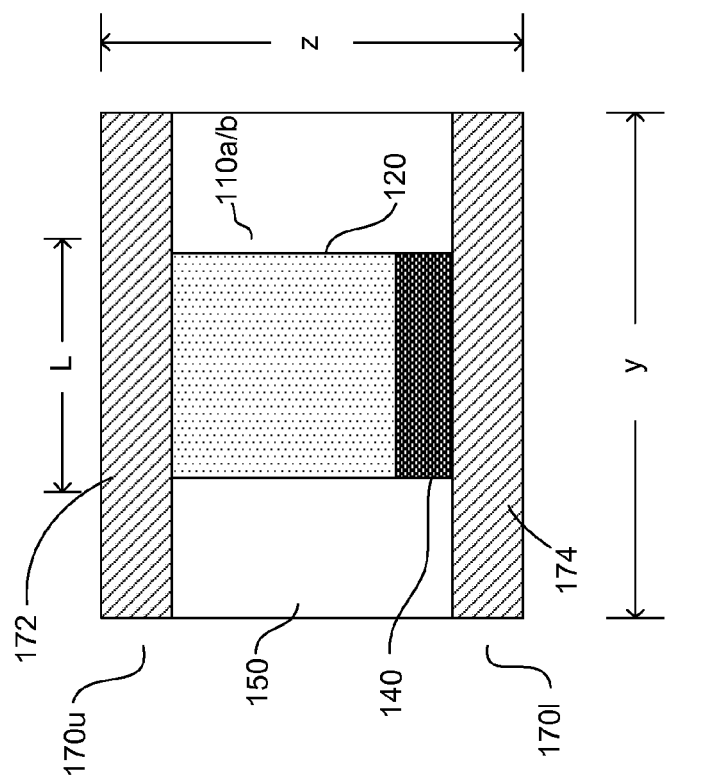
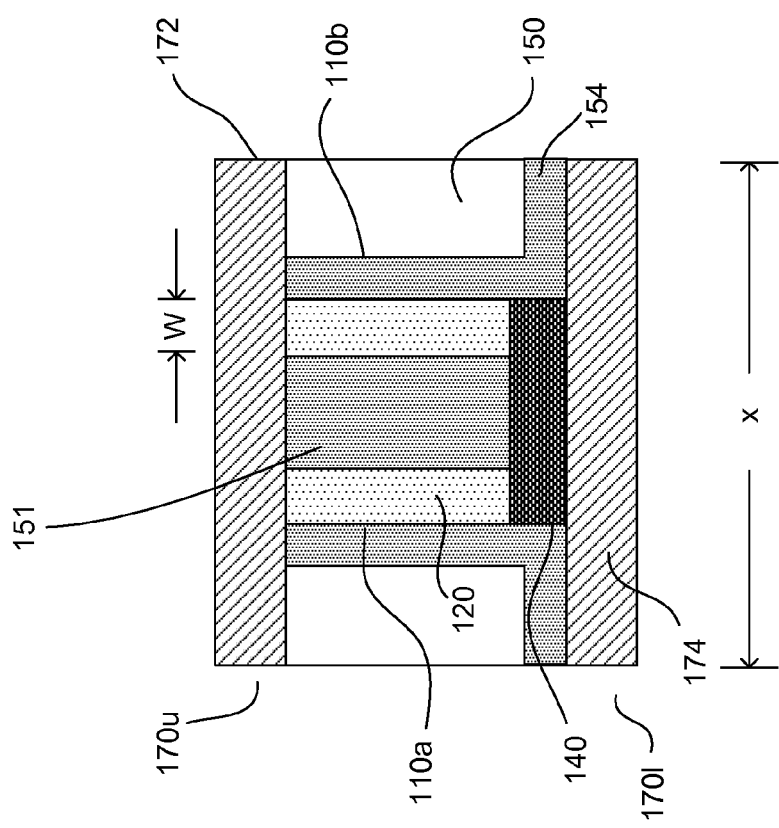

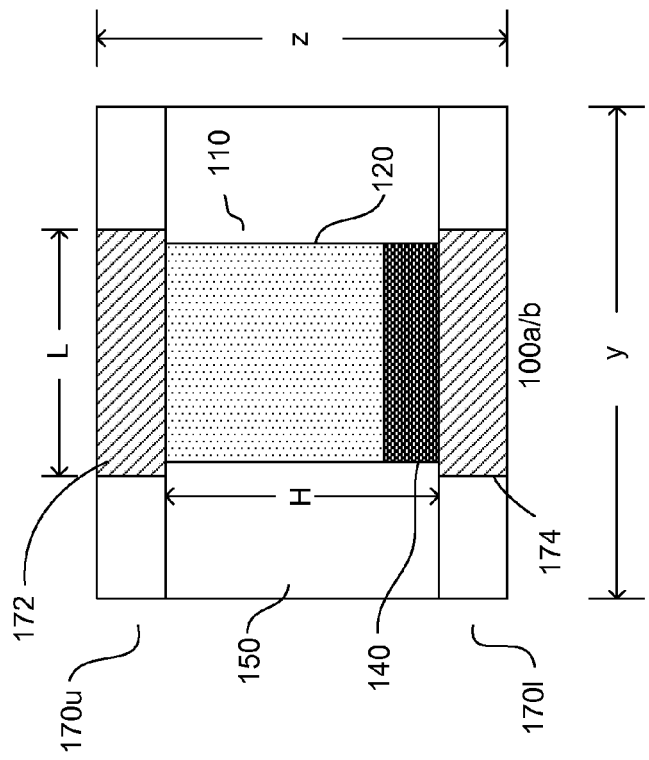
Fig. 1e₂
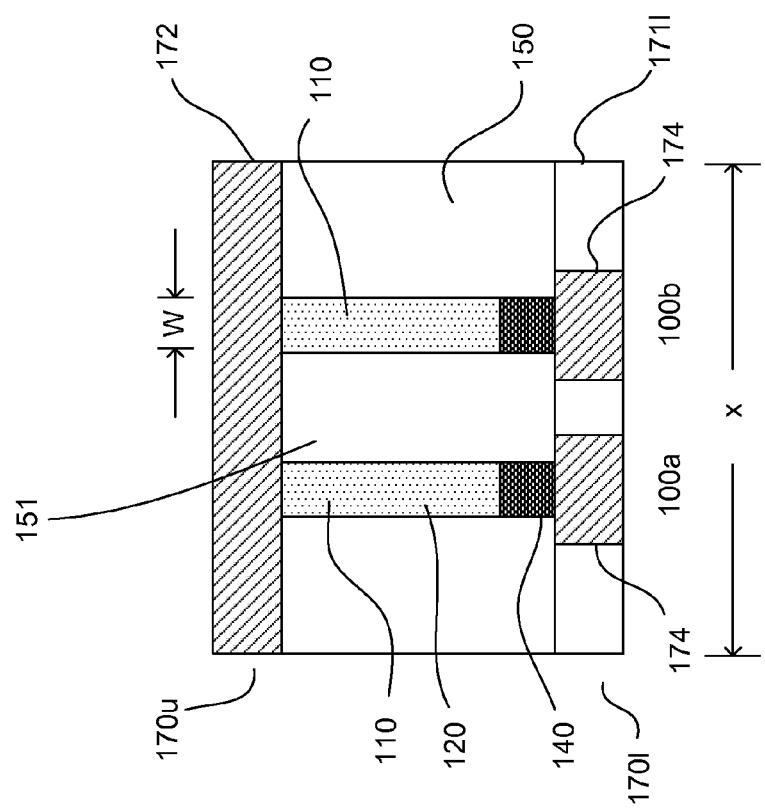
Fig. 1e₁

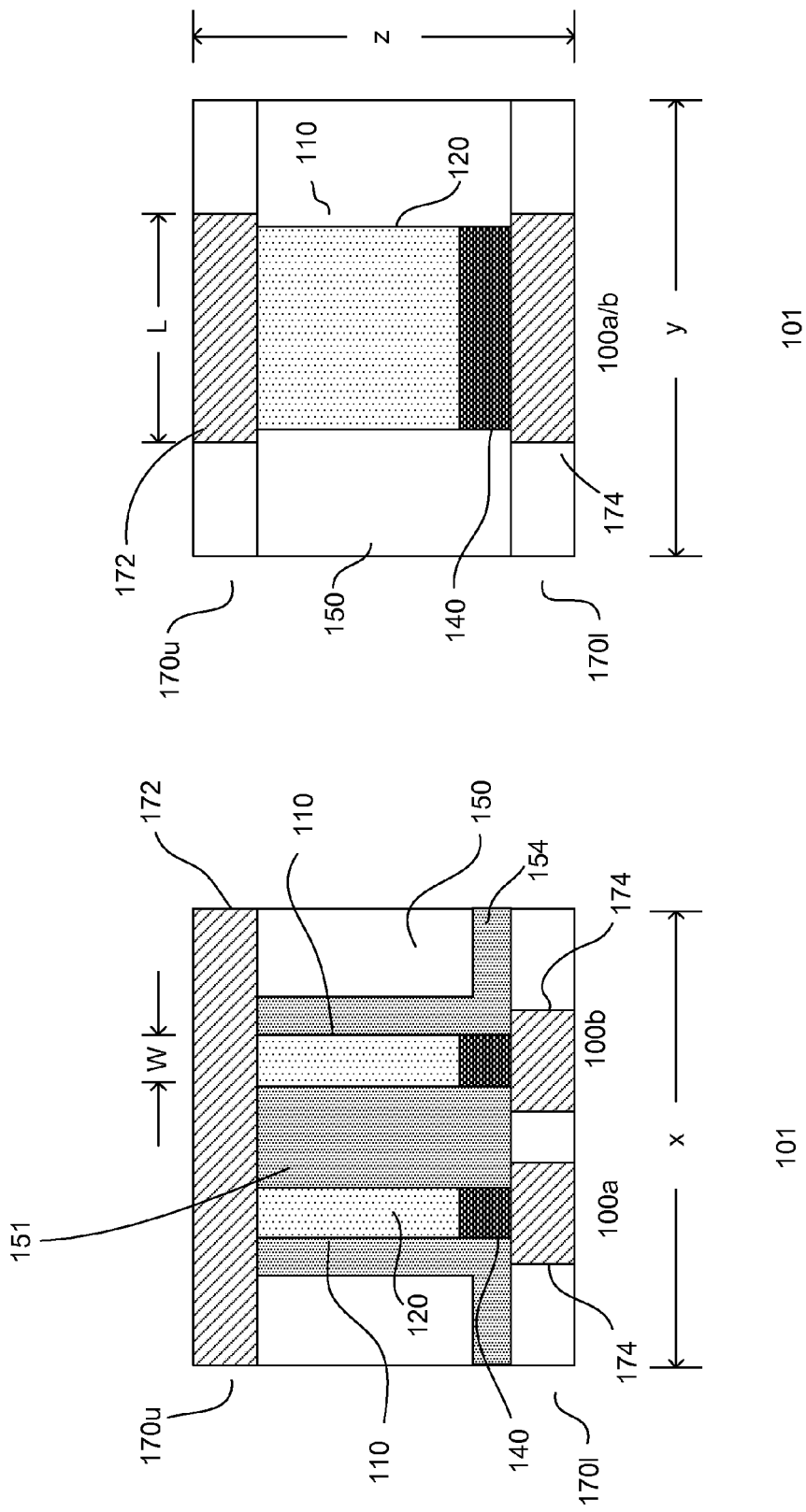

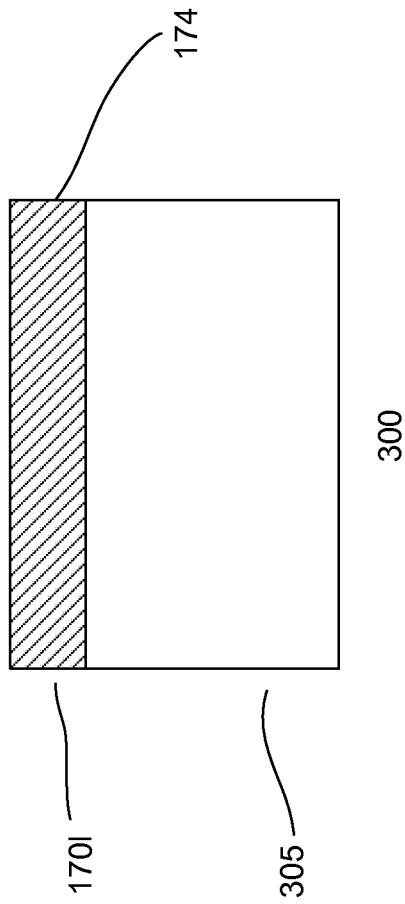

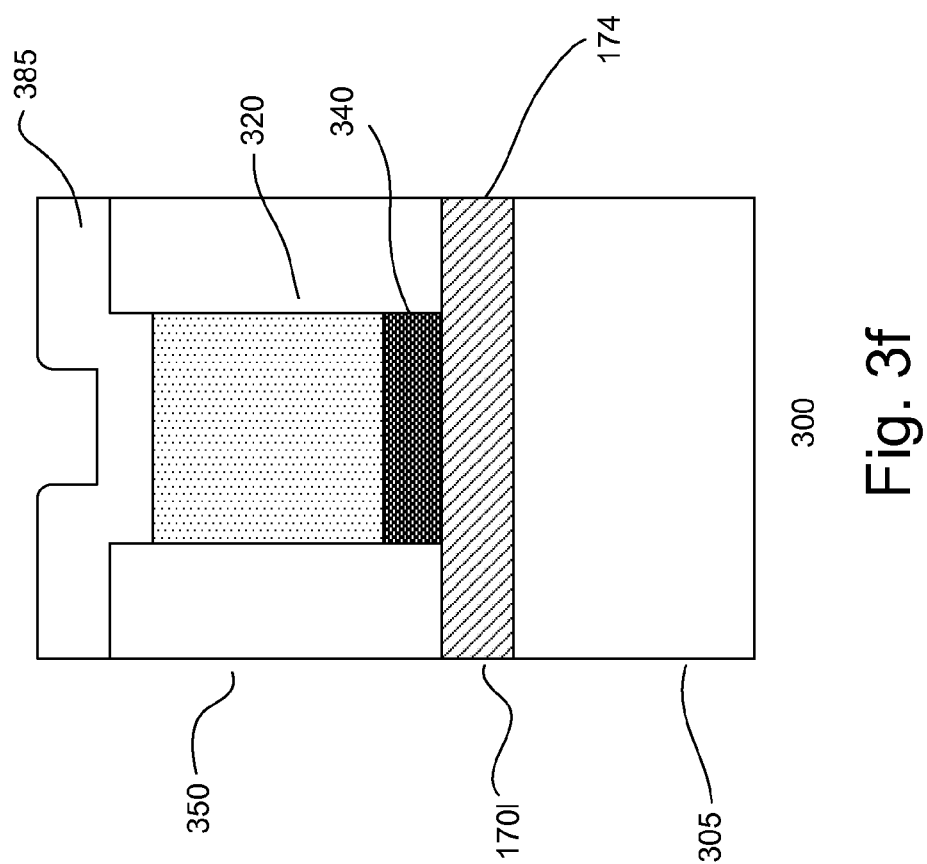

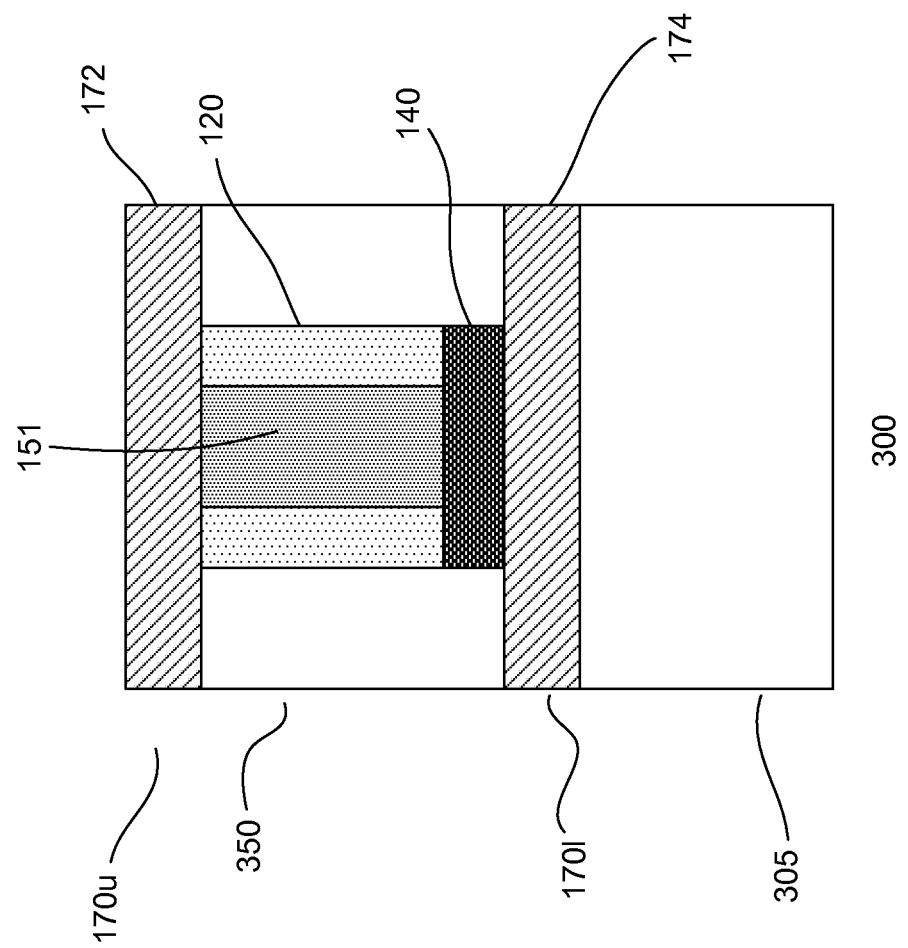

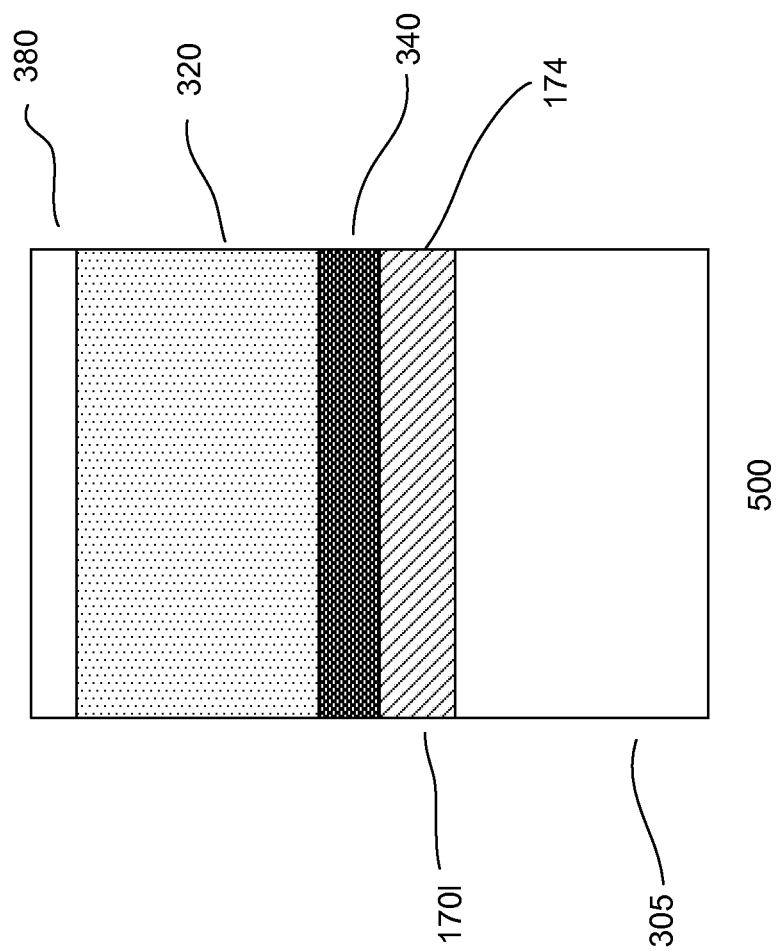

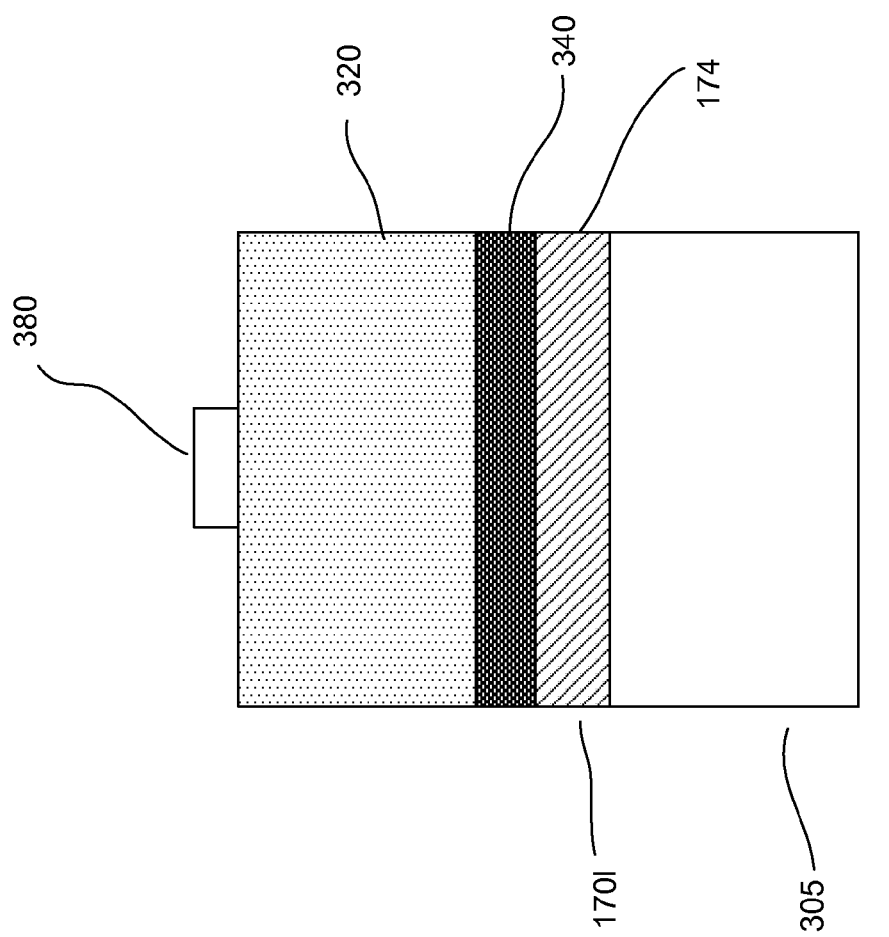

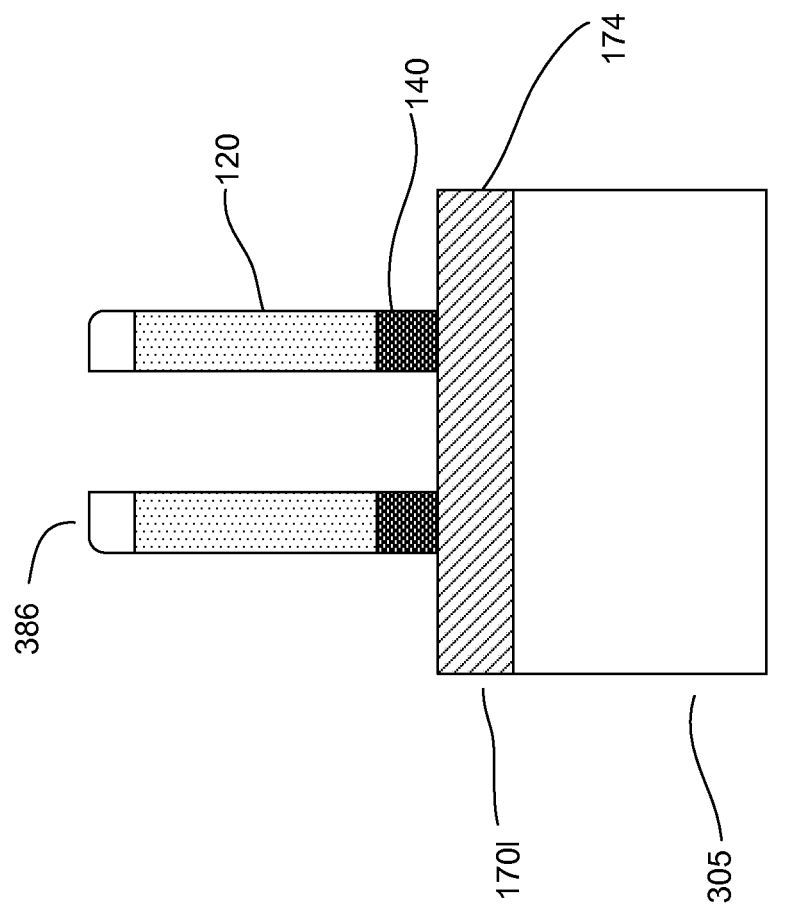

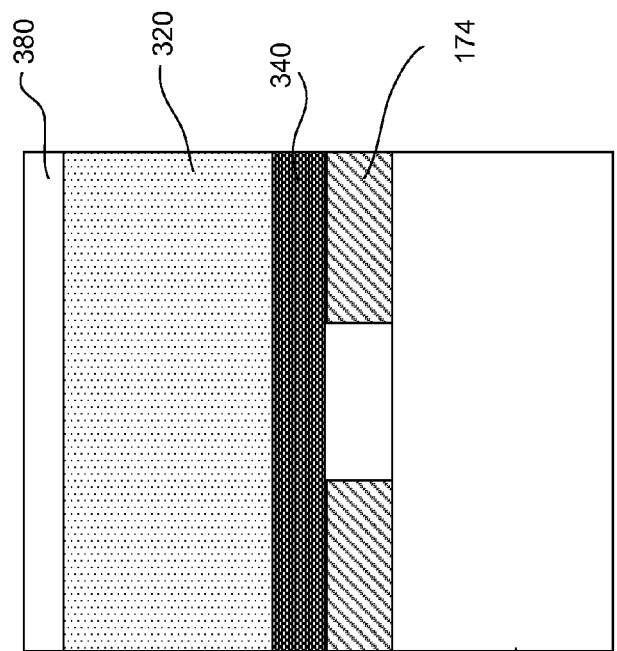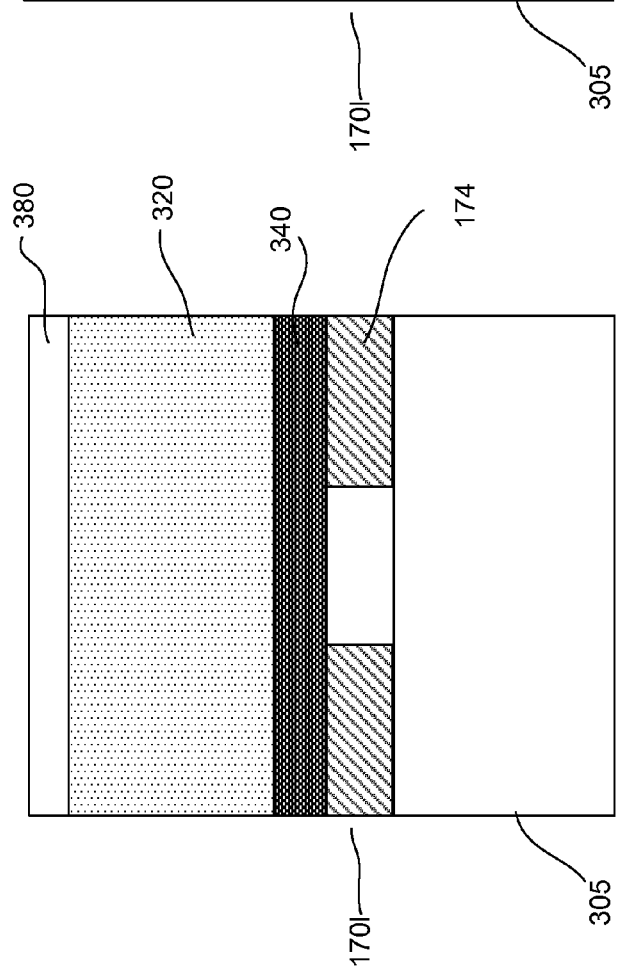

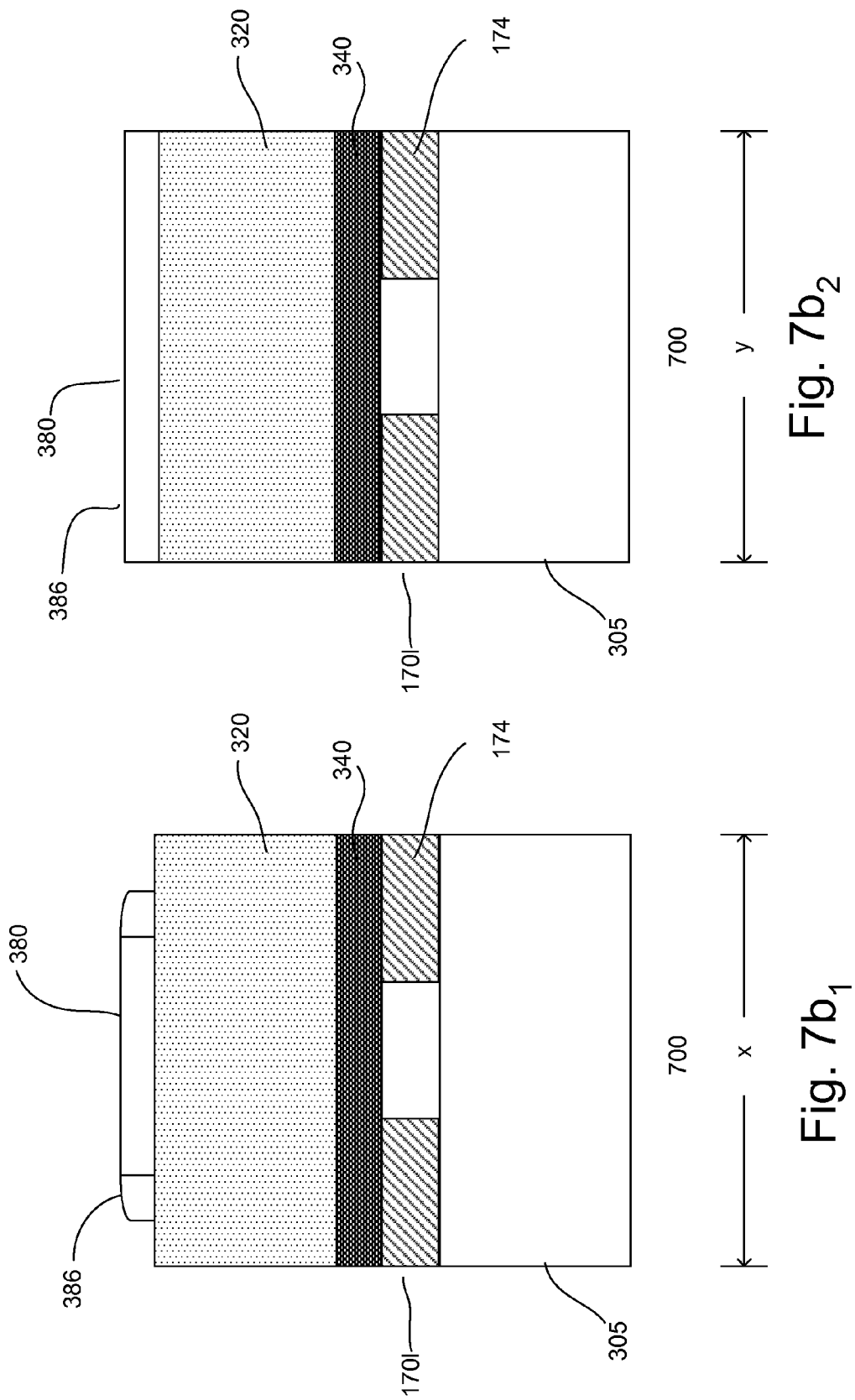

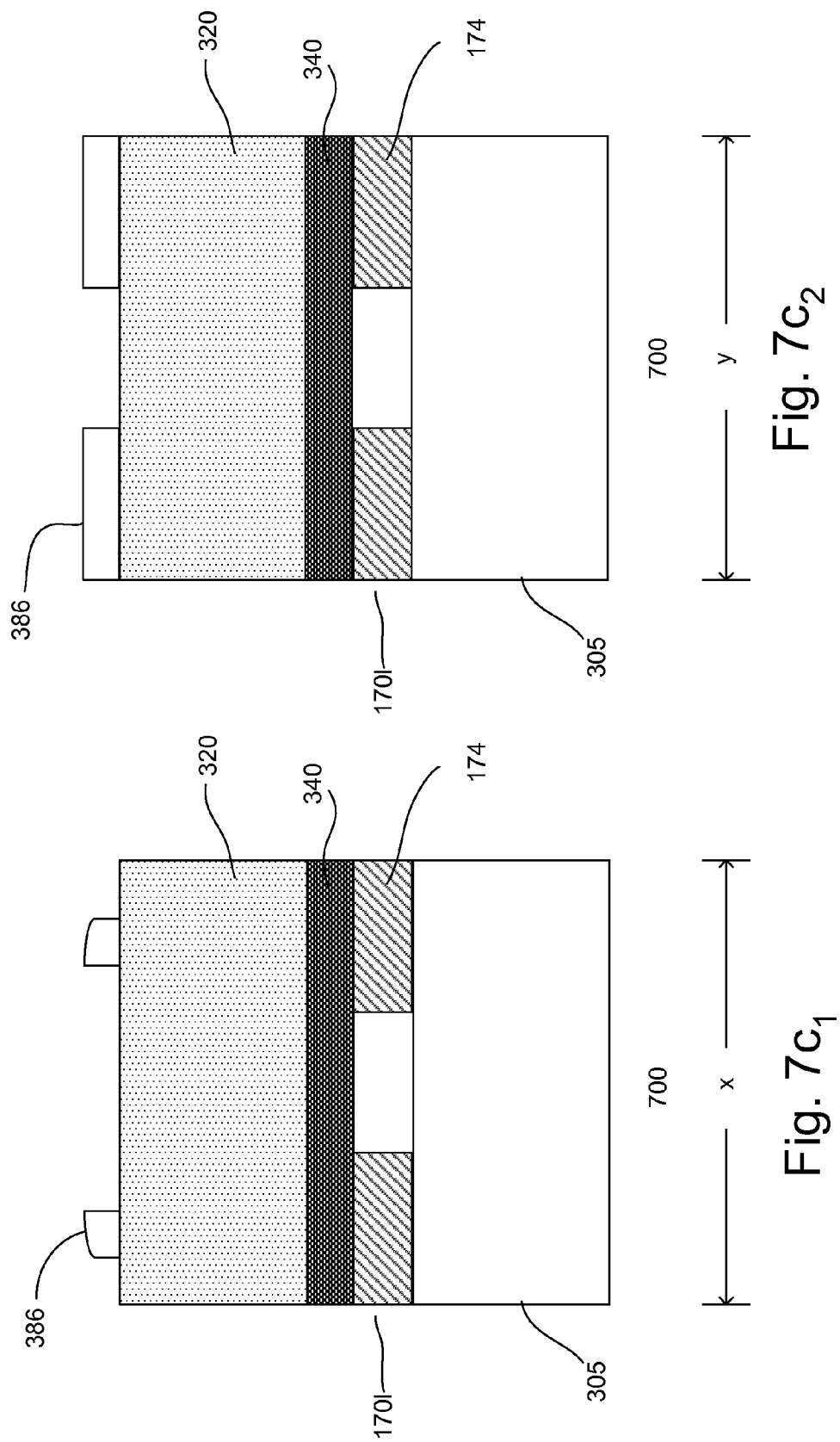

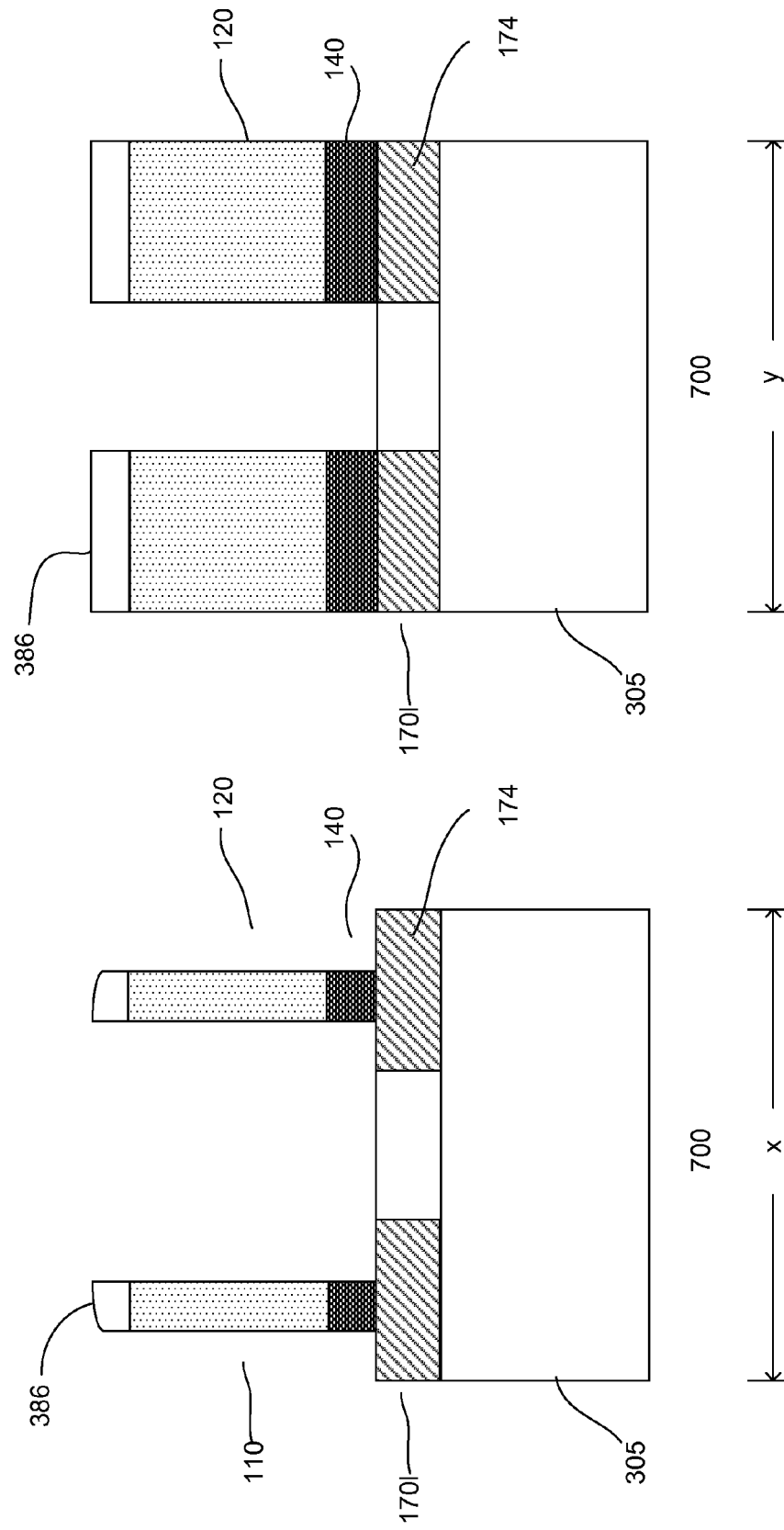

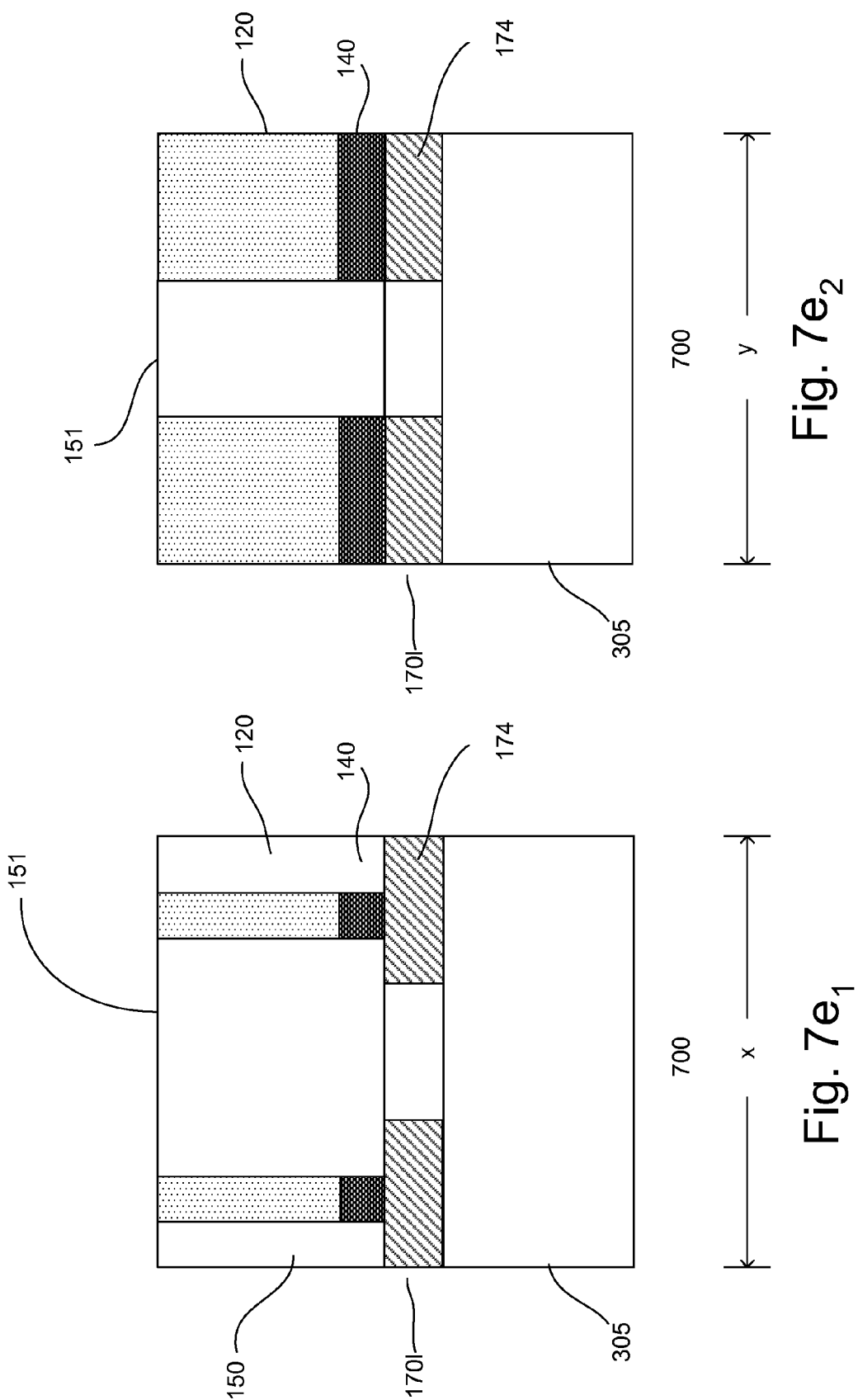

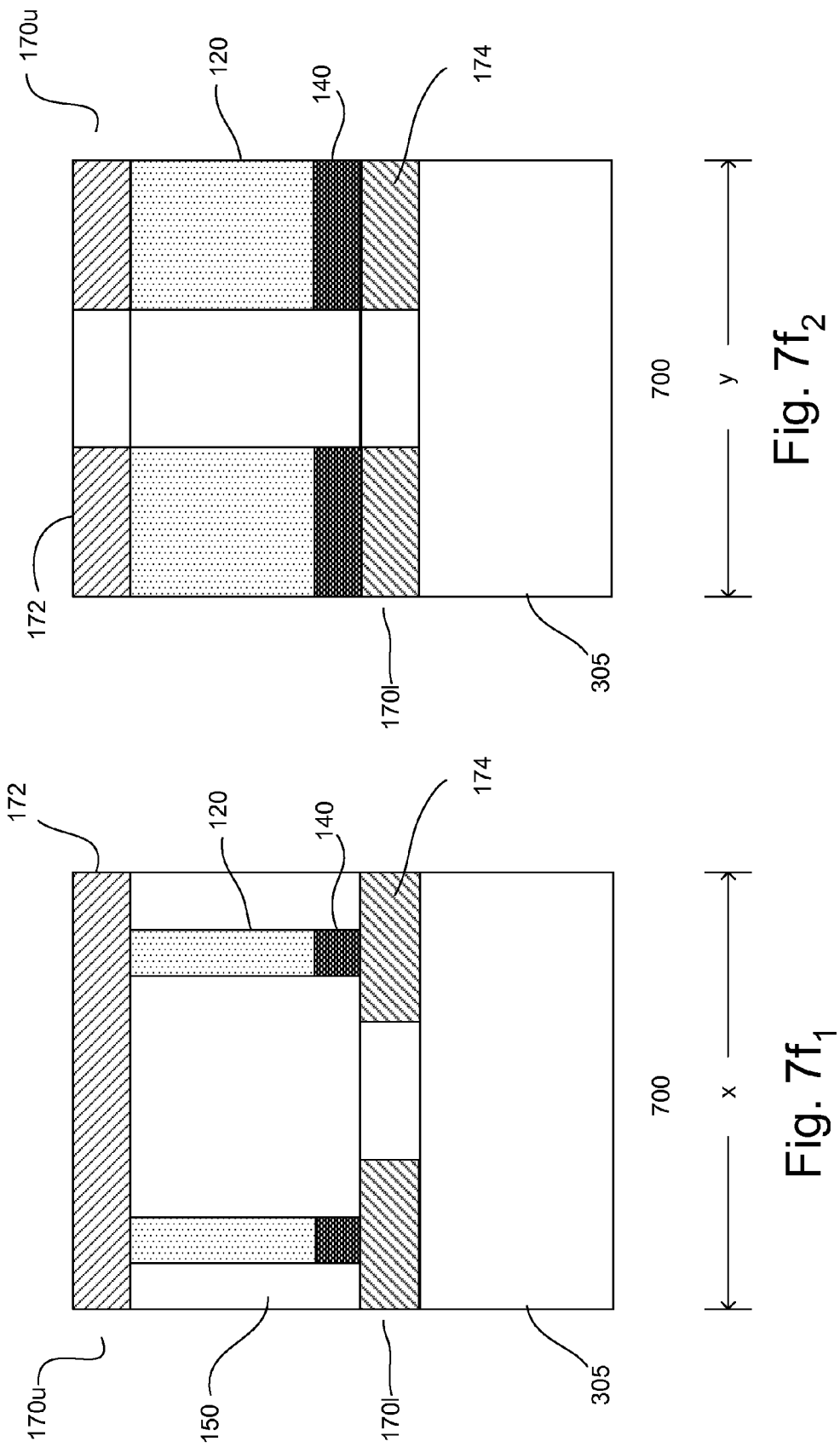

FIN-TYPE MEMORY

BACKGROUND

Resistive-type non-volatile memories (NVMs), such as phase change random access memories (PCRAMs) and resistive RAMs (RRAMs), employ memory elements having different stable resistive states. Such resistive elements enable data corresponding to the different resistive states to be stored. For PCRAMs, the memory element switches between the amorphous and crystalline phases. Switching between the two phases is achieved by heating the memory element using a heater. As for RRAMs, the memory element switches between the insulating and conducting phases by creating or destroying conductive filaments. Unlike flash memories, NVMs using resistive elements do not need high voltages to program the cells. This results in lower power consumption compared to flash memories as well as avoiding the need for high voltage masks for forming high voltage transistors in manufacturing such devices.

However, conventional resistive type memories have drawbacks. For example, conventional PCRAMs and RRAMs have large memory elements. For example, in PCRAMs, this leads to a large heater-to-memory element contact area which results in inefficient heating to switch the phase of the memory element. This increases power consumption. As for RRAMs, a large memory element leads to a large number of conductive filament current paths formed. This results in large resistance distribution, negatively impacting resistance state margins.

This disclosure is directed to resistive type memories with small memory elements with improved performance.

SUMMARY

Embodiments generally relate to semiconductor devices. In one embodiment, a method for forming a device is presented. A substrate prepared with a lower electrode level with bottom electrodes is provided. Fin stack layers are formed on the lower electrode level. Spacers are formed on top of the fin stack layers. The spacers have a width which is less than a lithographic resolution. The fin stack layers are patterned using the spacers as a mask to form fin stacks. The fin stacks contact the bottom electrodes. An interlevel dielectric (ILD) layer is formed on the substrate. The ILD layer fills spaces around the fin stacks. An upper electrode level is formed on the ILD layer. The upper electrode level has top electrodes in contact with the fin stacks. The electrodes and fin stacks form fin-type memory cells.

In another embodiment, a method for forming a device is disclosed. The method includes providing a substrate prepared with a lower electrode level with a bottom electrode. Layers of a fin stack are formed on the lower electrode level. A spacer is formed on top of the fin stack. The spacer has a width which is less than a lithographic resolution. The layers of the fin stack are patterned using the spacer as a mask to form a fin stack. The fin stack contacts the bottom electrode. An interlevel dielectric (ILD) layer is formed on the substrate. The ILD layer fills spaces around the fin stack. An upper electrode level is formed on the ILD layer. The upper electrode level has a top electrode in contact with the fin stack. The electrodes and fin stack form a fin-type memory cell.

In yet another embodiment, a device is disclosed. The device includes a substrate prepared with a lower electrode level with bottom electrodes. Fin stacks are disposed on and contact the bottom electrodes at the lower electrode level. Spacers are disposed on top of the fin stacks. The spacers have a width which is less than a lithographic resolution. An interlevel dielectric (ILD) layer is disposed on the substrate. The ILD layer fills spaces around the fin stacks. An upper electrode level is disposed on the ILD layer. The upper electrode level has top electrodes in contact with the fin stacks. The electrodes and fin stacks form fin-type memory cells.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following FIG. 1a-f shows various embodiments of memory cells;

FIGS. 3a-j show cross-sectional views of a process for forming an embodiment of a device;

FIGS. 5a-f show cross-sectional views of a process for forming another embodiment of a device;

FIGS. 6a-c show cross-sectional views of a process for forming another embodiment of a device; and FIG. 7a-f show cross-sectional views of another embodiment of a process for forming a device.

DETAILED DESCRIPTION

Figure 2:
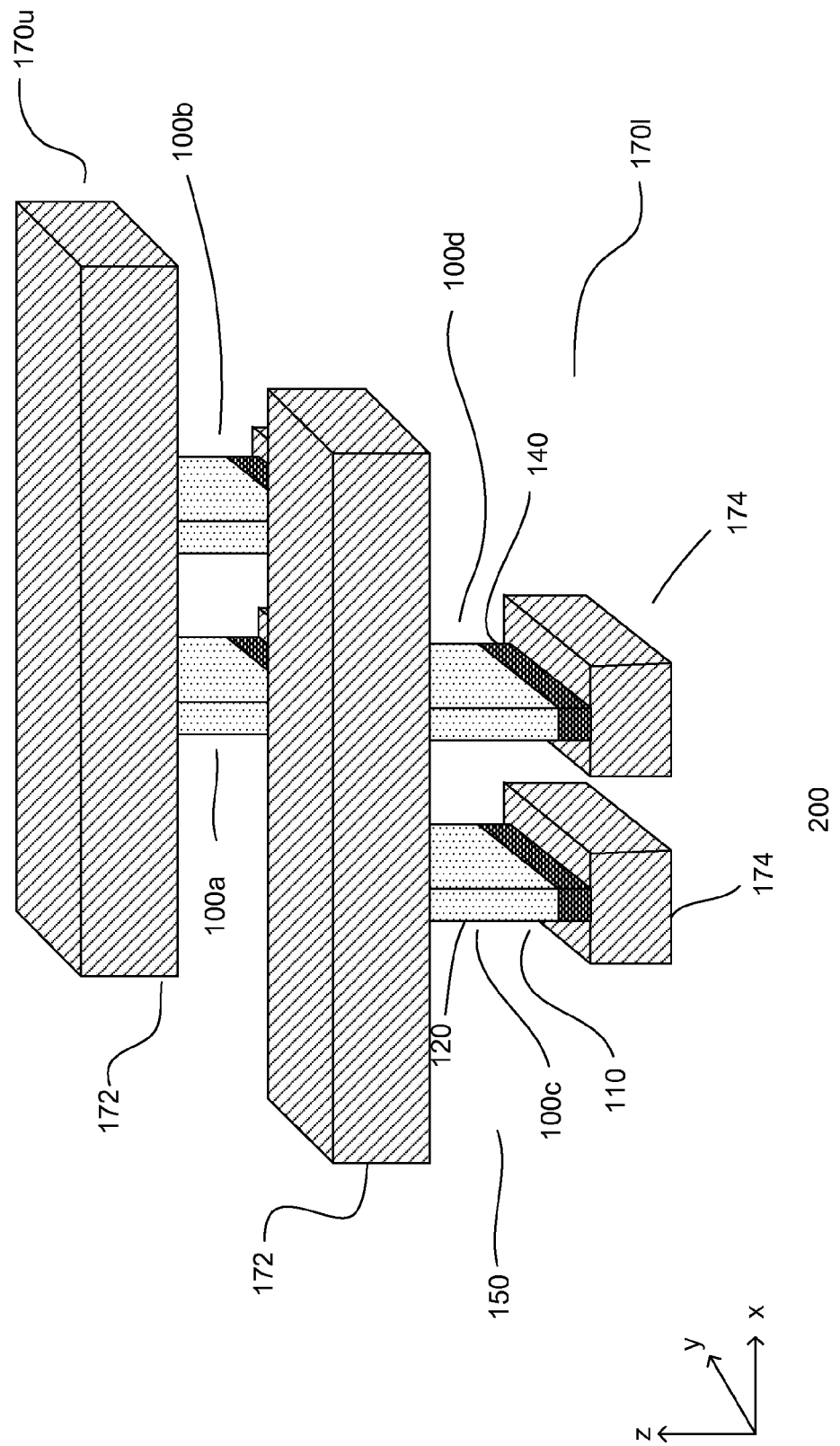
FIG. 2 shows an isometric view of a portion of an embodiment of a memory array.

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

FIGS. 1a-d show various embodiments of a fin-type memory cell 100. Figures with a subscript 1 show cross-sectional views of a memory cell 100 in a first (x) direction and Figures with a subscript 2 show cross-sectional views of the memory cell in a second (y) direction. The first and second directions are, in one embodiment, orthogonal to each other. Providing first and second directions which are configured at other angles with respect to each other may also be useful.

A portion of the device which includes the memory cell is shown. The memory cell is disposed on a substrate (not shown). The substrate, for example, is a semiconductor substrate, such as a silicon substrate. For example, the substrate may be a lightly doped p-type substrate. Providing an intrinsic or other types of doped substrates, such as such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be a dielectric insulating material. The insulator layer, for example, is formed from silicon oxide, providing a buried oxide (BOX) layer. Other types of dielectric insulating materials may also be useful. The COI substrate, for example, is a silicon-on-insulator substrate. For example, the surface and bulk crystalline layers are single crystalline silicon. Other types of COI substrates may also be useful. It is understood that the surface and bulk layers need not be the same material.

The memory cell, in one embodiment, includes top and bottom memory electrodes 172 and 174 formed on the substrate. The bottom electrode, for example, is more proximate to the substrate surface than the top electrode. The memory electrodes are disposed in upper and lower electrode levels 170u and 170l. The memory electrodes may be formed of metal, such as copper or copper alloy. Other suitable types of metals, alloys or conductive materials may also be useful.

The electrodes provide connections to a bitline or a wordline of a memory array. For example, one of the electrodes is connected to a bitline while the other is connected to a wordline. The electrodes may be directly or indirectly connected to a bitline or a wordline. The electrode connected to a bitline may be directly connected to the bitline. For example, a first electrode is directly connected to the bitline. In one embodiment, the first electrode connected to a bitline serves as the bitline. For example, the first electrode is an electrode conductor which is the bitline.

In one embodiment, the electrode connected to the wordline is indirectly connected to the wordline. For example, a second electrode is connected to the wordline via a selection element for accessing the memory cell. The wordline controls the selection element for accessing the memory cell. The second electrode may be directly or indirectly connected to the selection element. The selection element may be a transistor, such as a metal oxide field effect transistor (MOSFET) or a bipolar junction transistor (BJT). Other types of selection elements, such as diodes or any self-rectifying diode/contact, may also be useful.

Alternatively, the electrode connected to a wordline may be directly connected to the wordline. For example, a second electrode is directly connected to the wordline. In one embodiment, the second electrode connected to a wordline serves as the wordline. For example, the second electrode is an electrode conductor which is the wordline. In the case where both the top and bottom electrodes are electrode conductors, a selection element may be provided in series between the electrode conductors. The selection element, for example, may be a diode. Other types of selection elements may also be useful.

In one embodiment, the first electrode is the top electrode and the second electrode is the bottom electrode. The top electrode is coupled to the bitline. In one embodiment, the top electrode is the bitline. As for the bottom electrode it is coupled to the wordline. In one embodiment, the bottom electrode is coupled to the wordline via the selection element. Other configurations of top and bottom electrodes may also be useful. For example, the top electrode may be connected to the wordline while the bottom electrode may be connected to the bitline.

Electrodes may be formed in a metal level of an IC. For example, upper and lower electrode levels may correspond to upper and lower metal levels of an IC. The upper and lower metal levels may be adjacent metal levels of an IC. For example, the lower electrode may be disposed in a lower metal level Mi and the upper electrode may be disposed in an upper metal level Mi+1, where i is a metal level of the IC. The lower metal level may be the first metal level, such as M1, while the upper metal level may be the second metal level, such as M2. Providing other metal levels for the lower and upper electrodes, including non-adjacent metal levels, may also be useful. The metal levels may be specifically dedicated to the memory electrodes. The different metal levels are disposed along a third (z) direction. The third direction, for example, is orthogonal to the first and second directions. In some embodiments, the bottom electrodes may be via contacts disposed in the lower electrode level of an IC.

In the case where the lower electrode level is a metal level, it may be disposed on a dielectric layer (not shown). The dielectric layer may be, for example, a silicon oxide ($SiO_2$) dielectric layer. Other types of dielectric layer may also be useful. The dielectric layer isolates the lower electrode level from a component level below. The lower component level may be a metal level in the case where the lower electrode level is not the first metal level. For the case where the lower electrode level is the first metal level, the lower component level is the substrate. The substrate, for example, includes the selection elements as well as other circuit components. The bottom electrode may be indirectly connected to a contact region of a selection element by, for example, a contact plug. In other embodiments, the selection element may be disposed on component levels other than the substrate. In some cases, other types of component levels may be disposed below or above the lower electrode level.

In another embodiment, the lower electrode level is the substrate. For example, the bottom electrode is a metal silicide electrode formed on the substrate. The bottom electrode may be directly connected to or disposed on a contact region of a selection device.

An electrode level includes a plurality of electrodes. For example, the upper electrode level includes a plurality of top memory electrodes and the lower electrode level includes a plurality of bottom memory electrodes. A plurality of bitlines and wordlines interconnect electrodes of memory cells to form a memory array. Wordlines may be disposed in a first direction while bitlines are disposed in a second direction. The first and second directions may be orthogonal. Non-orthogonal first and second directions may also be useful. A wordline forms a row of memory cells and a bitline line forms a column of memory cells. The wordlines and bitlines form rows and columns of memory cells of the array. In the case where the electrodes are directly connected to or serving as wordlines and bitlines, a cross-point memory array is formed. For a cross-point memory array, selection elements may be provided in series between wordlines and bitlines at the crossing points. Other configurations of electrodes or memory arrays may also be useful.

The electrodes are formed in an intra-electrode dielectric (IED) layer. For example, top memory electrodes are formed in an upper IED layer and bottom memory electrodes are formed in a lower IED layer. The IED layer isolates electrodes of an electrode level from each other. The IED layer, for example, may be an intra-metal dielectric (IMD) layer. In some embodiments, for example, in the case where the lower electrode level is directly coupled to the selection element, the IED layer may also isolate electrodes as well as selection elements and other devices from each other. The IED layer, for example, may be formed of $SiO_2$. Other types of dielectric materials may also be useful. For example, the dielectric layer may be formed of fluorosilicate glass (FSG), polyimides, carbon doped $SiO_2$ and low k dielectrics, such as nanoporous methylsilsesquioxane (MSSQ).

The upper and lower IED levels are separated by an interlevel dielectric (ILD) layer 150. The ILD level, for example, may be an ILD level between IMD levels. The ILD level, for example, may be formed of $SiO_2$. Other types of dielectric materials may also be useful. For example, the dielectric layer may be formed of fluorosilicate glass (FSG), polyimides, carbon doped $SiO_2$ and low k dielectrics, such as nanoporous methylsilsesquioxane (MSSQ). In one embodiment, the IED and ILD materials are the same. Providing IED and ILD having different dielectric materials may also be useful. Furthermore, it is understood that etch stop layers, such as silicon nitride, may be provided between the IED and ILD layers. Other configurations of ILD and IED layers may also be useful. For example, in some embodiments, the lower IED and ILD levels may be the same layer. For example, in the case where the lower electrode level is a metal silicide level on the substrate, the lower IED and ILD levels may be the same layer.

Illustratively, a memory cell includes first and second fins 110a-b, forming a 2 fin/cell fin-type memory cell. Other configurations of fin-type memory cells may also be useful. For example, a 1 fin/cell fin-type memory cell may also be useful.

A fin includes a fin body. In one embodiment, the fin body includes a main fin body 120 and a secondary fin body 140. The main fin body, in one embodiment, is a resistive element having multiple stable resistive states. The main fin body serves as a storage element for a fin-type resistive memory cell. Two resistive states of the main fin body correspond to a bit of data. For example, one of the two states corresponds to a logic "0" and the other of the two states corresponds to a logic "1" to the bit of data. In one embodiment, the main fin body is a bi-stable resistive element having first and second stable resistive states. For example, the main fin body has a stable high resistive state and a stable low resistive state, with one corresponding to a logic "0" and the other corresponding to a logic "1".

The fin, as shown, has a width (W) along the x-direction, a length (L) along the y-direction and a height (H) along the z-direction. In one embodiment, a width of the fin is less than a lithographic resolution or definition (e.g., sub-lithographic dimension). For example, the width of the fin may be about 5-50 nm. Other widths may also be useful. As for the length, it may be equal to about the lithographic dimension. The height of the fin, for example, may be about 10-500 nm. In one embodiment, the distance between outer (non-adjacent) edges of the fins of the memory cell may be equal to the lithographic dimension. Other fin dimensions or distances may also be useful.

The space between adjacent fins of the memory cell is filled with an interfin dielectric (IFD) 151. For example, the space between adjacent fins along the x-direction is filled with the IFD. The IFD may be formed of the same material as the ILD layer 150. In other embodiments, the IFD and ILD may be formed of different materials. For example, the IFD may include a low or bad thermal conducting material. Other configurations of ILD and IFD may also be useful. For example, both the ILD and IFD may be bad thermal conductors.

The secondary fin body 140 may be provided in communication with the main fin body. The secondary fin body is disposed between the main fin body and a memory electrode. The secondary fin body provides electrical communication between the main fin body and a memory electrode. As shown, the secondary fin body is disposed between the main fin body and bottom memory electrode. Providing a secondary fin body disposed between the main fin body and the top memory electrode may also be useful.

The secondary fin body may serve various functions. In one embodiment, the secondary fin body may be used to program the resistive state of the main fin body. For example, the secondary fin body is used to set the main fin body into a desired resistive state, depending on the data to be stored by the memory cell. In one embodiment, both fins of the memory cell are programmed to be in the same resistive state.

In the case of a phase change random access memory (PCRAM) cell, the secondary fin body may be a heater used to change the phase of the main fin body to the desired phase. In other embodiments, such as in the case of a resistive RAM (RRAM) cell, the secondary fin body may serve to enhance the formation or destruction of filament in the main fin body or just an intermediate electrode to provide electrical connection to the memory electrode. Providing secondary fin bodies which serve other functions may also be useful.

The fin bodies form a fin stack. As shown in FIGS. 1a and 1c, a main fin body is provided with its respective secondary fin body. The secondary fin body, for example, may have the same width and length dimensions as the fin. Providing secondary fin bodies with different dimensions than the fin may also be useful. The height of the secondary fin body, in one embodiment, should be sufficient to provide effective programming of the main fin body. The secondary fin body, for example, may have a height of about 1-10 nm. Other heights for the secondary fin body may also be useful. In some embodiments, as shown in FIGS. 1b and 1d, the main fin bodies of the memory cell share a common secondary fin body. The common secondary fin body, for example, may have the same footprint as main fin bodies of the memory cell, including the IFD. Providing common secondary fin bodies of other sizes or other configurations of fin bodies may also useful. In other embodiments, no secondary fin bodies are provided for the memory cell.

A dielectric liner 154 may be provided to line, for example, sides of the fin structures. In one embodiment, as shown in FIGS. 1c-d, the dielectric liner lines the sides of the fin structures and a top of the lower electrode level, for example, between adjacent memory cells. The dielectric liner, in one embodiment, includes a lower or bad thermal conducting material. Other types of dielectric liners may also be useful.

In one embodiment, the dielectric liner and IFD are formed of the same material. For example, the dielectric liner and IFD may serve as bad thermal conductors. Other configurations of the dielectric liner and IFD may also be useful. For example, the dielectric liner and IFD may be formed of different materials.

FIGS. 1e-f show various other embodiments of memory cells 101. Figures with a subscript 1 show cross-sectional views of memory cells in a first (x) direction and Figures with a subscript 2 show cross-sectional views of the memory cells in a second (y) direction. The first and second directions are, in one embodiment, orthogonal to each other. Providing first and second directions which are configured at other angles with respect to each other may also be useful. The memory cells are similar to those described in FIGS. 1a-d. Common elements may not be described or described in detail.

A portion of a device which includes a plurality of memory cells 101 is shown. For example, the portion of the device includes first and second memory cells 100a-b. The memory cell is disposed on a substrate (not shown). The substrate, for example, is a semiconductor substrate, such as a silicon substrate. Other types of substrates are also useful.

A memory cell includes top and bottom memory electrodes 172 and 174 formed in upper and lower IED levels 170u and

1701. The electrodes provide connections to a bitline or a wordline of a memory array. For example, one of the electrodes is connected to a bitline while the other is connected to a wordline. An electrode may be directly or indirectly connected to a bitline or a wordline. One of the electrodes may be connected to a selection element. For example, the bottom electrode may be connected indirectly to the wordline via the selection element while the top electrode serves as the bitline. A memory cell is provided with a selection element. The selection element, for example, may be disposed on the substrate. Providing selection elements at other component levels may also be useful In one embodiment, the top electrode is a common electrode for the memory cells. For example, the top electrode may be a top electrode conductor along the first direction. The top electrode, for example, may serve as a bitline. The bitline connects a plurality of memory cells, for example, in the x direction, forming a column of memory cells. As shown, a memory cell is provided with its respective bottom electrode. For example, the first memory cell is provided with a first bottom electrode and the second memory cell is provided with a second bottom electrode. A bottom electrode may be directly or indirectly connected to a wordline. For example, a bottom electrode may be indirectly connected to a wordline by a selection element. The first bottom electrode may be connected to a first wordline and the second bottom electrode may be connected to a second wordline. In other embodiments, a bottom electrode is directly connected to a wordline. For example, the first bottom electrode is a first wordline and the second bottom electrode is a second wordline of a cross-point array. A wordline connects a plurality of memory cells in the y direction, forming a row of memory cells. In an array, a plurality of bitlines and wordlines are provided to interconnect memory cells. Other configurations of electrodes, wordlines, bitlines and selection elements, such as those described in FIGS. 1a-d, may also be useful. For example, the top electrodes may be connected to wordlines and the bottom electrodes may be connected to bitlines.

The upper and lower IED levels are separated by an ILD layer 150. In some embodiments, the lower IED and ILD levels may be the same layer. For example, in the case where the bottom electrode is a metal silicide electrode on the substrate, the lower IED and ILD levels may be the same layer. Other configurations of IED levels and ILD layer may also be useful.

A memory cell includes a fin 110, forming a fin-type memory cell. In one embodiment, one fin is provided for a memory cell, forming a 1 fin/cell fin type memory cell. Other configurations of fin-type memory cells may also be useful. A fin includes a fin body. In one embodiment, the fin body includes a main fin body 120 and a secondary fin body 140. The main fin body, in one embodiment, is a resistive element having multiple stable resistive states. The main fin body serves as a storage element for a fin-type resistive memory cell. Two resistive states of the fin body correspond to a bit of data. For example, one of the two states corresponds to a logic "0" and the other of the two states corresponds to a logic "1" to the bit of data. In one embodiment, the fin body is a bi-stable resistive element having first and second stable resistive states. For example, the fin body has a stable high resistive state and a stable low resistive state, with one corresponding to a logic "0" and the other corresponding to a logic "1".

The fin, as shown, has a width (W) along the x-direction, a length (L) along the y-direction and a height (H) along the z-direction. In one embodiment, a width of the fin is less than a lithographic resolution or definition (e.g., sub-lithographic dimension). For example, the width of the fin may be about 5-50 nm. Other widths may also be useful. As for the length, it may be equal to about the lithographic dimension. The height of the fin, for example, may be about 10-500 nm. In one embodiment, the distance between outer (non-adjacent) edges of the fins of the memory cells of the cell pair may be equal to the lithographic dimension. Other fin dimensions as well or distances may also be useful.

The space between adjacent fins is filled with an IFD 151. For example, the space between adjacent fins along the x-direction is filled with the IFD. The IFD may be formed of the same material as the ILD layer 150. In other embodiments, the IFD and ILD may be formed of different materials. In some embodiments, the IFD includes a bad thermal conducting material. Other configurations of ILD and IFD may also be useful. For example, both the ILD and IFD may be bad thermal conductors.

The secondary fin body may be provided in communication with the main fin body. The secondary fin body is disposed between the main fin body and a memory electrode. The secondary fin body provides electrical communication between the main fin body and a memory electrode. As shown, the secondary fin body is disposed between the main fin body and bottom memory electrode. Providing a secondary fin body disposed between the main fin body and the top memory electrode may also be useful.

The secondary fin body may serve various functions. In one embodiment, the secondary fin body is used to program the resistive state of the main fin body. For example, the secondary fin body is used to set the main fin body into a desired resistive state, depending on the data to be stored by the memory cell.

In the case of a phase change random access memory (PCRAM) cell, the secondary fin body may be a heater used to change the phase of the main fin body to the desired phase. In other embodiments, such as in the case of a resistive RAM (RRAM) cell, the secondary fin body may serve to enhance the formation or destruction of filament in the main fin body or just an intermediate electrode to provide electrical connection to the memory electrode. Providing secondary fin bodies which serve other functions may also be useful.

The fin bodies form a fin stack. As shown, a main fin body is provided with its respective secondary fin body. The secondary fin body, for example, may have the same width and length dimensions as the main fin body. Providing fin bodies with different dimensions may also be useful. The height of the secondary fin body, in one embodiment, should be sufficient to provide effective programming of the main fin body. The secondary fin body, for example, may have a height of about 1-10 nm. Other heights for the secondary fin body may also be useful.

A dielectric liner 154 may be provided to line, for example, sides of the fin structures. In one embodiment, as shown in FIG. 1f, the dielectric liner lines the sides of the fin structures and a top of the lower electrode level, for example, between adjacent memory cells. The dielectric liner, in one embodiment, includes a bad thermal conducting material. Other types of dielectric liners may also be useful. In one embodiment, the dielectric liner and IFD are formed of the same material. For example, the dielectric liner and IFD may serve as bad thermal conductors. Other configurations of the dielectric liner and IFD may also be useful. For example, the dielectric liner and IFD may be formed of different materials.

FIG. 2 shows a simplified isometric view of an embodiment of a portion of a memory array 200. The portion of the array includes 1 fin/cell memory cells. The memory cells, for example, are similar to those shown in FIGS. 1e-f. Common elements may not be described or described in detail. As shown, the portion includes memory cells 100a-d. Although four memory cells are shown, it is understood that a memory array include many more cells disposed in the x and y directions.

A memory cell includes a fin 110 disposed between top and bottom electrodes 172 and 174. The fin is disposed in an ILD layer 150 between upper and lower electrode levels 170u and 170l. A fin includes a main fin body 120 and a secondary fin body 140. The main fin body is a resistive element having multiple stable resistive states. In one embodiment, the main fin body is a resistive element having first and second states. Providing the fin body with 2n states, where n is a whole number greater than 1 may also be useful. For example, the fin body may have 4 states or more. As for the secondary fin body, it may serve to program the resistive state of the main fin body or serve as an intermediate electrode. As shown, the secondary fin body is disposed between the main fin body and bottom electrode. Other configurations of fin bodies, including no secondary fin body, may also be useful.

An IFD (not shown) is disposed between fins. The IFD may be formed of the same or different material than the ILD layer. In one embodiment, the IFD includes a bad thermal conducting material. Other configurations of ILD and IFD may also be useful. For example, both the ILD and IFD may be bad thermal conductors. The memory cells may include a dielectric liner (not shown) lining the sides of the fin structures. The dielectric liner may be formed of the same material as the IFD. For example, the dielectric liner and IFD may be bad thermal conductors. Other configurations of the dielectric liner and IFD may also be useful.

As shown, the top electrodes 172 in the upper electrode level are electrode conductors. For example, the memory cells are coupled by top memory conductors disposed in the upper electrode level in the first direction (e.g., x direction). A top electrode conductor connects a plurality of memory cells in the x direction. In one embodiment, a top electrode conductor may be a bitline coupling a plurality of memory cells in the x direction, forming a column of memory cells.

Regarding the bottom electrodes, they are isolated bottom electrodes. For example, one bottom electrode is provided for one memory cell. A bottom electrode, for example, is coupled to a wordline. In one embodiment, a bottom electrode is connected indirectly to a wordline via a selection element (not shown). The selection element may be disposed on the substrate. Providing the selection element at other levels may also be useful. A wordline connects a plurality of memory cells, for example, via the selection element, in the second or y direction.

In other embodiments, a bottom electrode is directly coupled to a wordline. For example, a bottom electrode is a wordline which connects a plurality of memory cells in the y direction. Such a configuration produces a cross-point array. For a cross-point array, a selection element of a memory cell, such as a diode, is disposed between the electrodes. In one embodiment, a diode of a memory cell is disposed between the fin body and bottom electrode. Other configuration of the selection element and electrodes may also be useful.

As discussed, an array includes a plurality of memory cells in the first and second directions. The memory cells are interconnected by wordlines in the y or row direction and bitlines in the x or column direction.

In other embodiments, the bottom electrodes may be electrode conductors serving as bitlines and the top electrodes may be isolated electrodes connected to selection elements. Other configurations of electrodes may also be useful. For example, top and bottom electrodes may be electrode conductors, serving as bitlines and wordlines. This, for example, forms a cross-point array.

As shown, the portion of the array includes 1 fin/cell memory cells. In other embodiments, the portion of the array may include 2 fin/cell memory cells. For example, the portion of the array may include 2 fin/cell memory cells as described in FIGS. 1a-d.

As described in FIGS. 1a-f and 2, the fin-type memory cells may be different types of fin-type memory cells. For example, the fin-type memory cells may be phase change random access memory (PCRAM) cells or resistance random access memory (RRAM) cells. Providing other types of memory cells may also be useful.

In one embodiment, the memory cells are PCRAMs. In the case of PCRAMs, the main fin body is formed of a phase change (PC) material. The PC material can be in a first or second state. In one embodiment, the first state is a high resistive state and the second state is a low resistive state. In one embodiment, the high resistive state is an amorphous phase and the low resistive state is a crystalline phase. For example, the amorphous phase or first state represents a logic "0" while the crystalline phase or second state represents a logic "1". Other configurations of data storage for the PCRAM may also be useful. For example, the PCRAM may have $2^n$ resistive states, where n is a whole number greater than 1. For example, the PCRAM may have 4 resistive states, representing 00, 01, 10 and 11. Other number of resistive states may also be useful.

The PC material may be changed from one phase to the other. In either phase or state, the PC material is stable until reset or set. The PC material, for example, is stable at below a threshold temperature. For example, the threshold temperature is about 85° C. Other threshold temperatures may also be useful and may depend on the type of PC material employed. The threshold temperature, for example, should be above normal operating temperature of the device. The retention of the PC material should be, for example, 10 years. The PC material may be reset to the amorphous phase from the crystalline phase by exposing it to a reset condition or set from the amorphous phase to the crystalline phase by exposing it to a set condition.

In one embodiment, the set condition includes heating the PC material at its amorphous phase to a crystallization temperature for a sufficient time to transform it to a crystalline phase. On the other hand, the reset condition includes heating to melt the crystalline PC material and rapidly cooling it so it becomes amorphous. Heating the PC material includes appropriately passing current to a heater or a heating element.

The phase change material, in one embodiment, is formed of a chalcogenide material. In one embodiment, the chalcogenide material is a GeSbTe alloy. In one embodiment, the chalcogenide material is $Ge_2Sb_2Te_5$ (GST). Other types of chalcogenide or phase change materials may also be employed to serve as the main fin body of the memory cell.

In one embodiment, the secondary fin body serves as a heater for setting and resetting a fin. The secondary fin body, for example, is formed of a heat generating (HG) material. In one embodiment, the HG material generates heat when current flows through it. The HG material, for example, may be formed of titanium nitride (TiN). Other types of HG materials which can serve as a heater may also be useful.

In one embodiment, the IFD 151 is formed of a bad thermal conductive (BTC) material. A BTC material, for example, may be a low k or porous dielectric material. Other types of BTC material, including air, may also be useful. In other embodiments, the IFD layer and ILD layer are formed of a BTC material. For example, the IFD and ILD layers are formed of a porous or low k dielectric material. It is understood that the IFD and ILD layers need not be formed of the same BTC material. For example, the IFD may be air while the ILD layer may be a porous dielectric material. In yet other embodiments, as shown in FIGS. 1c-d and f, the dielectric liner which surrounds the fins is formed of a BTC material. The liner, for example, fills the space between the fins of a memory cell pair to serve as IFD. In such case, the ILD layer may be a non-BTC material. Providing an ILD with a BTC material may also be useful.

As described, the PCRAM is a fin-type cell in which the fin has a width less than the lithographic dimension. This results in a small heater to fin contact area. Additionally, the fin may be confined or thermally insulated with BTC material, which reduces thermal crosstalk between adjacent memory cells. These features advantageously result in increased heating efficiency which reduces reset current required. As such, lower voltage is needed which reduces the overall power consumption.

In another embodiment, the memory cells are RRAMs. In the case of RRAMs, the main fin body is formed of a programmable resistive (PR) material. The PR material can be in a first or second resistive state. In one embodiment, the first state is a high resistive state and the second state is a low resistive state. For example, the high resistive state represents a logic "0" while the low resistive state represents a logic "1". Other configurations of data storage for the RRAM may also be useful. For example, the RRAM may have $2^n$ resistive states, where n is a whole number greater than 1. For example, the RRAM may have 4 resistive states, representing 00, 01, 10 and 11. Other number of resistive states may also be useful.

In one embodiment, the PR material includes hafnium oxide ($HfO_2$) or tantalum oxide ($TaO_x$). Other types of PR materials may also be useful. A PR material is subjected to a forming procedure which creates conduction paths of filaments after the fin is formed. The filaments can be reset or broken by subjecting the fin to a reset procedure or condition; the filaments can be set or re-formed by subjecting the fin to a set procedure or condition. A reset fin with broken filaments results in a high resistive state (e.g., logic "0") while a set fin with formed or re-formed filaments results in a low resistive state (e.g., logic "1").

A secondary fin body may be provided for a RRAM cell. The secondary fin body, in one embodiment, may be formed of a PR material. For example, the secondary fin body may be formed of the same PR material as the main fin body. Providing a secondary fin body formed of PR materials different from that of the main fin body may be also useful. In some embodiments, the secondary fin body may be formed of an electrode material. For example, the secondary fin body may be formed of titanium (Ti), TiN or TaN to serve as an intermediate or bottom electrode. Other suitable types of electrode materials may also be useful. In other embodiments, the secondary fin body may be formed of an oxygen gettering material. For example, the secondary fin body may be formed of hafnium (Hf), aluminum oxide ($Al_2O_3$) and aluminum hafnium oxide (AlHfO). Other types of oxygen gettering materials may also be useful. In yet other embodiments, no fin buffers may be provided for the RRAM cell.

The IFD and ILD layers may be formed of dielectric materials used in conventional metal levels. For example, the dielectric material may be silicon oxide. Other types of dielectric materials may also be useful. It is understood that the IFD and ILD need not be formed of the same material. In some embodiments, a dielectric liner may be provided to line the fins. The dielectric liner and ILD may be formed of different dielectric materials.

As described, the RRAM is a fin-type cell in which the fin has a width less than the lithographic dimension. This results in a small electrode to fin contact area. Providing a small electrode to fin contact area limits the number of filament current paths formed in the fin to a small number. This advantageously tightens resistance distribution of the RRAM cells, improving sensing window margins to enable multi-level operations. Furthermore, the RRAM cell consumes less power than conventional RRAM cells.

FIGS. 3a-j show cross-sectional views of a process of forming an embodiment of a device 300. The process includes forming a memory cell. The memory cell, in one embodiment, is a 2 fin/cell memory cell. The 2 fin/cell memory cell is similar to that described in, for example, FIG. 1a. Common elements may not be described or described in detail. The cross-sectional views are along the x direction. In one embodiment, the process is employed to form a PCRAM cell. Although the cross-sectional views show one memory cell, it is understood that the device includes a plurality of memory cells of, for example, a memory array.

Referring to FIG. 3a, a substrate 305 is provided. The substrate, for example, is a semiconductor substrate, such as a silicon substrate. Other types of semiconductor substrates, including silicon-germanium (SiGe), germanium (Ge), gallium-arsenic (GaAs) or any other suitable semiconductor materials as well as COI, may also be useful. The substrate may include a substrate component level. The substrate component level may include circuit components, such as transistors. A dielectric layer may be provided over the substrate component level to isolate the substrate from one or more upper component levels, such as metal levels.

In one embodiment, the substrate is prepared with a lower electrode level 1701. The lower electrode level may be any component level. For example, the lower electrode level may be any component level. For example, the lower electrode level may be any metal level of the device. The lower electrode level, for example, includes a bottom electrode 174 formed in an IED level. The bottom electrode may be an island or via bottom electrode. The island electrode may be connected to a selection element. In other embodiments, the bottom electrode may be a bottom electrode conductor on a component level other than the substrate level. In some other embodiments, the lower electrode level may be the substrate component level. The bottom electrode, for example, is a silicide contact which may be connected to a contact region of a selection element.

Figure 3B:
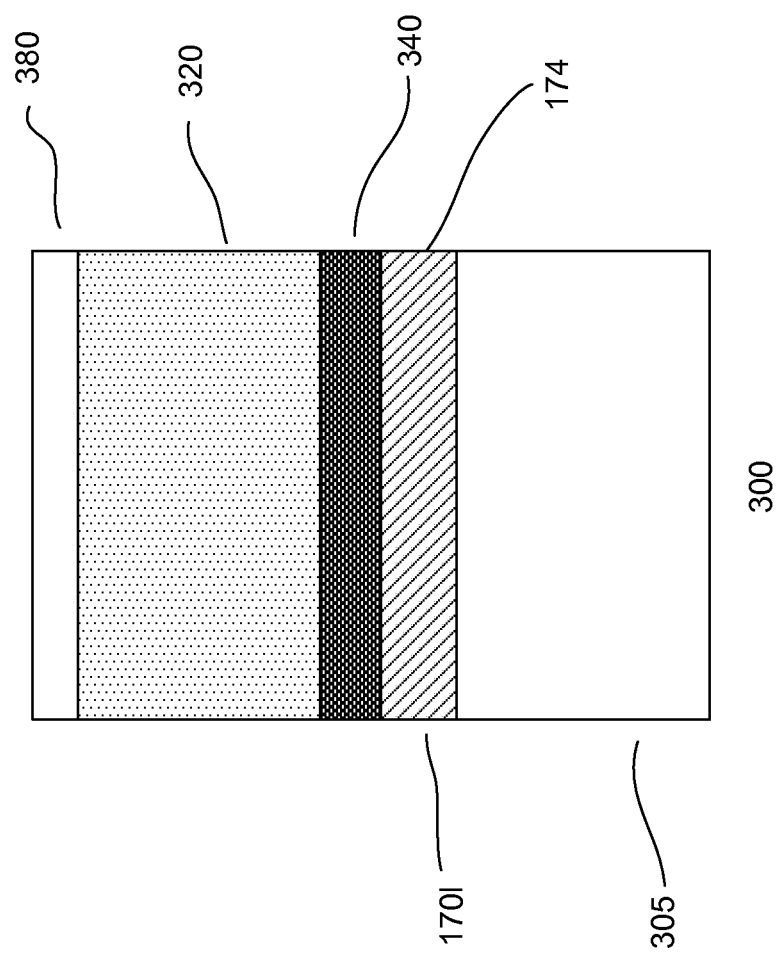

In FIG. 3b, layers of a fin stack are formed on the lower electrode level. In one embodiment, the fin stack layers include a secondary fin body layer 340 and a main fin body layer 320. In one embodiment, the secondary fin body layer is a HG layer and the main fin body layer is a PC layer. The thicknesses of the layers are selected to be equal to about the height of the secondary and main fin bodies. As shown, the secondary fin body layer is disposed below the main fin body layer. Alternatively, the secondary fin body layer is disposed above the main fin body layer. A hard mask layer 380 is disposed on top of the fin stack layers.

In one embodiment, the hard mask is formed of silicon nitride. Other suitable types of hard mask material may also be useful. The thickness of the hard mask, for example, may be about 10-100 nm. Other thicknesses may also be useful. The various layers may be formed by chemical vapor deposition (CVD). Other processes, such as sputtering, ebeam and PVD, may also be useful. The process, for example, may depend on the type of layer to be formed.

Figure 3C:
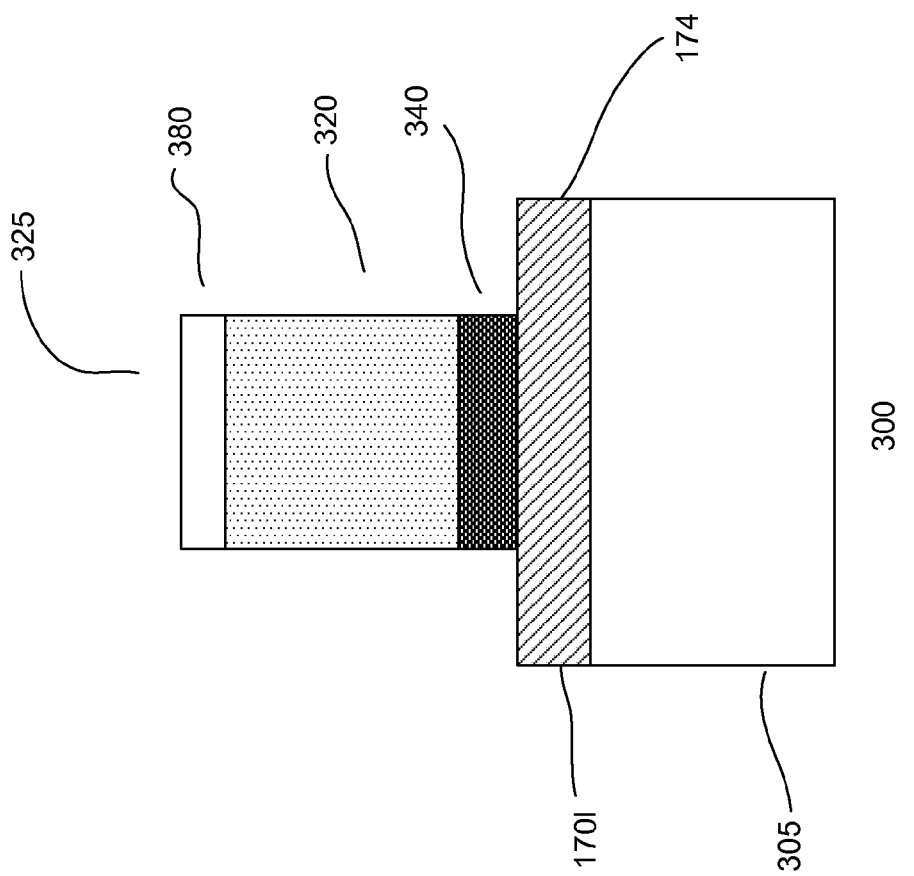

The process continues to define the cell area for 2 fin/cell memory cell, as shown in FIG. 3c. The cell area definition is achieved by patterning the hard mask, leaving the patterned hard mask corresponding to the cell area. The hard mask may be patterned using mask and etch techniques. For example, a soft mask layer, such as photoresist is patterned, exposing it with an exposure source through a reticle using a lithographic system. The exposed soft mask layer is developed, transferring the pattern of the reticle to the resist. The patterned soft mask exposes portions of the underlying hard mask layer. The patterned soft mask is used to pattern the hard mask layer. For example, an anisotropic etch, such as RIE is used to remove exposed portions of the hard mask layer. This transfers the pattern of the soft mask to the hard mask layer.

The patterned hard mask is used to pattern the exposed fin stack layers. For example, exposed portions of the fin stack layers are removed by RIE. This produces a fin block 325 corresponding to the cell area. In one embodiment, the width and length of the fin block is equal to about the lithographic dimension. Providing a fin block with other widths and lengths may also be useful. Alternatively, the soft mask can be used to pattern the hard mask layer and fin stack layers.

Figure 3D:
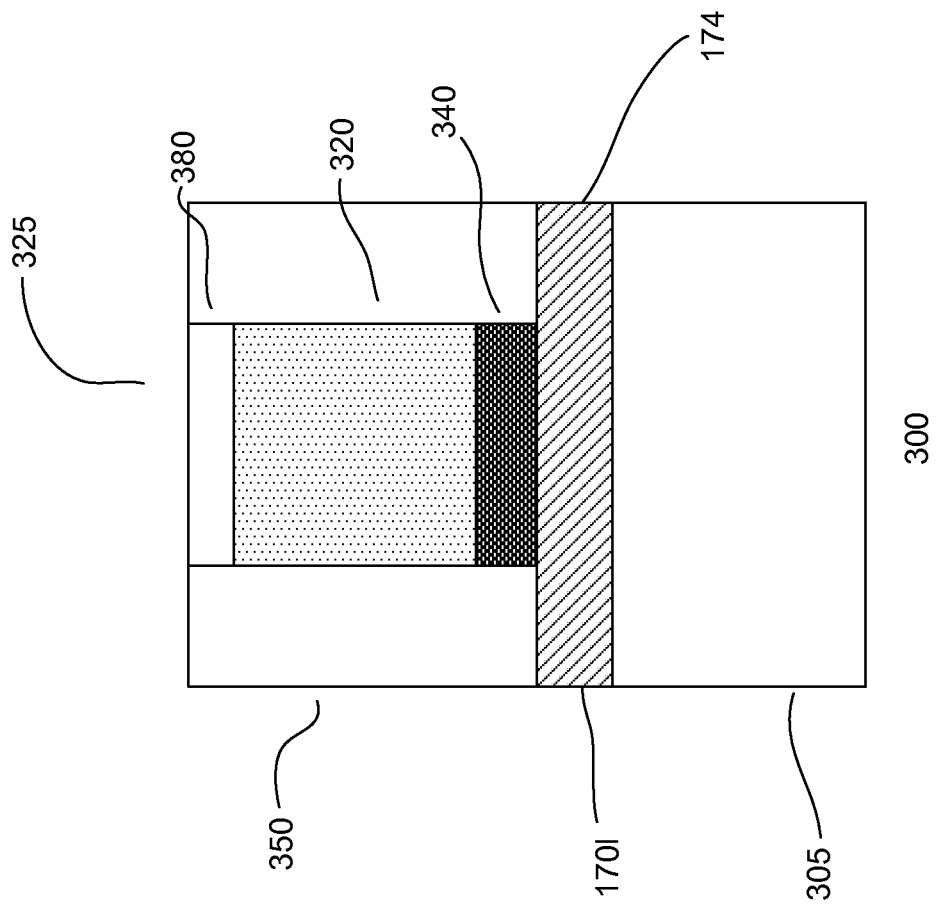

Referring to FIG. 3d, a dielectric layer 350 is formed on the substrate. The dielectric layer, for example, is at least equal to a height of the fin block, including the hard mask layer. The dielectric layer serves as the ILD layer of the memory cells. In one embodiment, the ILD layer is formed of a BTC dielectric material. In some embodiments, the dielectric material may be ILD materials used in metal levels. The dielectric layer, for example, may be formed by CVD. Other techniques, such as sputtering or ebeam, may also be useful. Excess dielectric material may be removed by a planarizing process. The planarizing process, for example, may include chemical mechanical polishing (CMP). Other types of planarizing processes may also be useful. The planarizing forms a planar surface between the ILD layer and top of the hard mask.

Figure 3E:
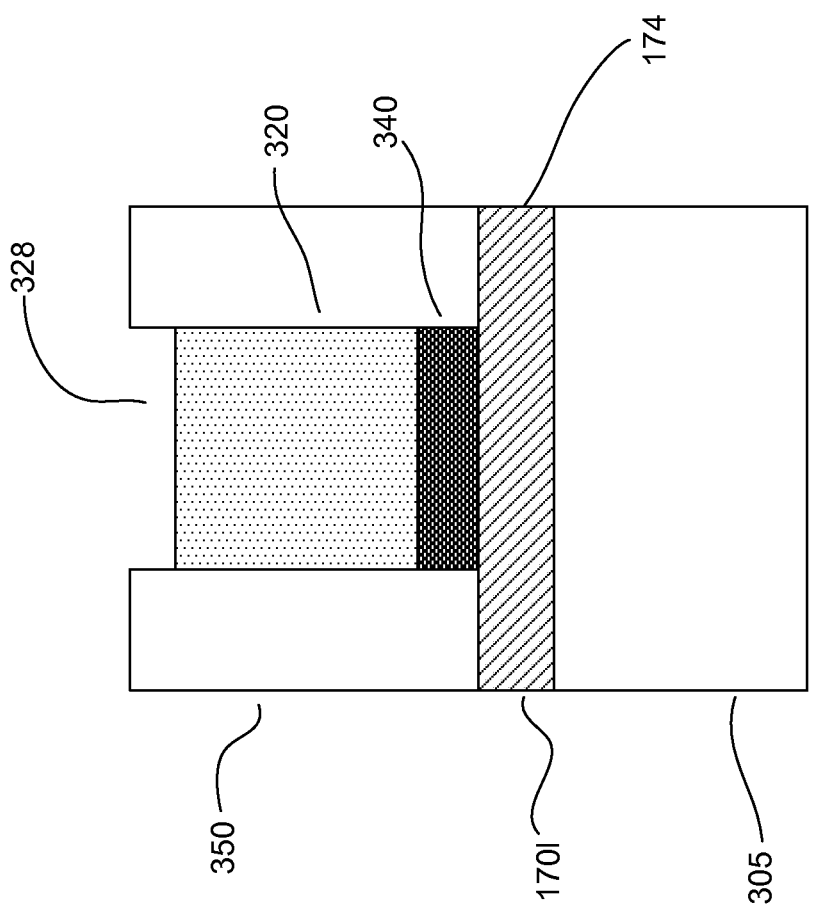

After the planarizing process, the hard mask layer over the fin block is removed, as shown in FIG. 3e. In one embodiment, the patterned hard mask layer is removed by a wet etch. Other techniques for removing the patterned hard mask layer may also be useful. Removing the hard mask forms a recess 328 above the fin block.

The process continues to form spacers after removal of the patterned hard mask layer. In FIG. 3f, a spacer layer 385 is formed on the substrate, covering the surface of the ILD and fin block. The spacer layer, in one embodiment, includes nitride or oxide material. Other types of materials, including dielectric and conductive materials, which can be removed selectively to the fin and ILD materials may also be useful. The thickness of the spacer layer is equal to about a width of the spacer to be formed. In one embodiment, the thickness of the spacer layer is selected to be equal to about a width of the fin or fin stack.

Figure 3G:
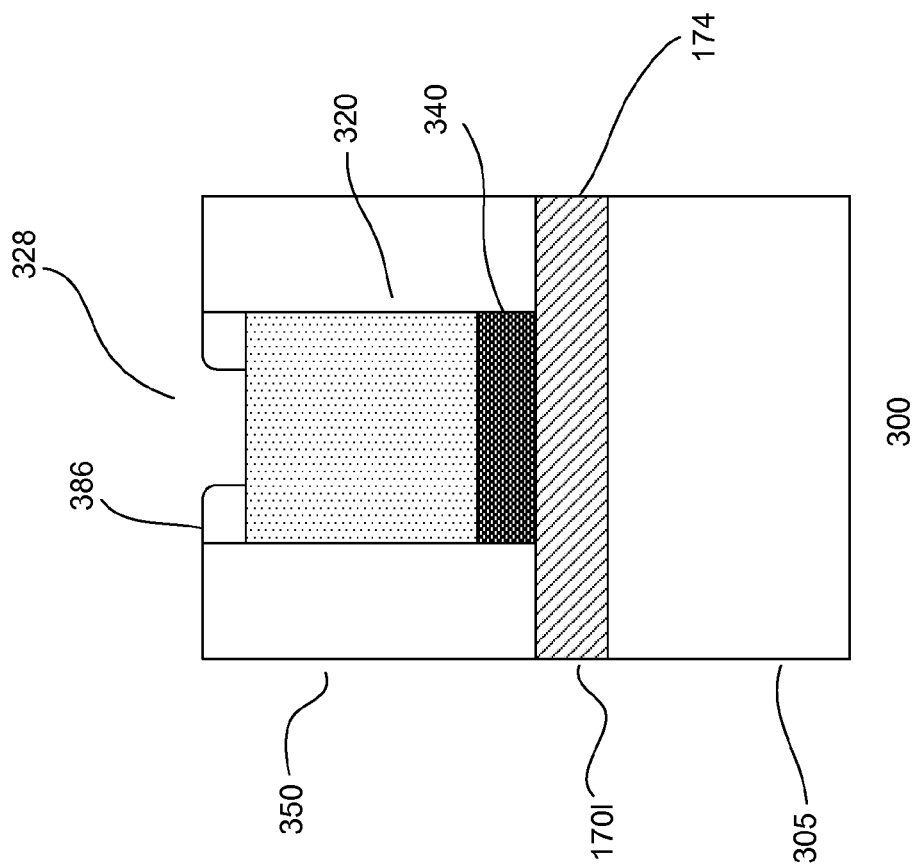

Referring to FIG. 3g, the spacer layer is patterned using an anisotropic etch, such as an RIE. The RIE removes horizontal components of the spacer layer, leaving a spacer 386 disposed in the recess. After the spacer is formed, it is preferably patterned to define the cell area. For example, the spacer may be a rectangular spacer, with a rectangular opening in the center. The spacer may be etched, for example, using a anisotropic etch, such as an RIE, with an etch mask, such as photoresist, to remove two opposing sides, leaving two separate parallel spacers. In some embodiment, the spacer may remain as it is. In some embodiments, the cell definition is performed after forming the spacer layer, prior to forming the spacers. For example, the spacer layer is patterned to define the cell area prior to the etch that forms the spacers.

Figure 3H:
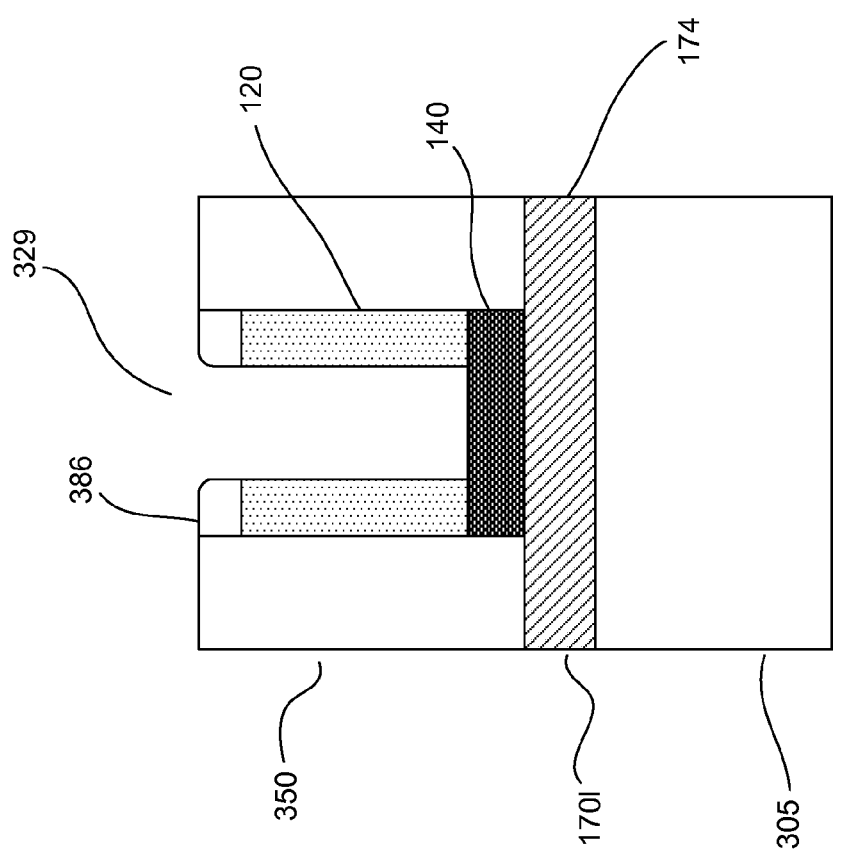

As shown in FIG. 3h, an anisotropic etch, such as an RIE, is performed. The etch is selective to the spacers and ILD layer. This enables the portion of the fin stack unprotected by the spacers to be removed, forming first and second main fin bodies 120 with a gap or opening 329 between them. In one embodiment, the etch is also selective to the HG layer, leaving a common secondary fin body 140 coupled to the main fin bodies and bottom electrodes.

Figure 3I:
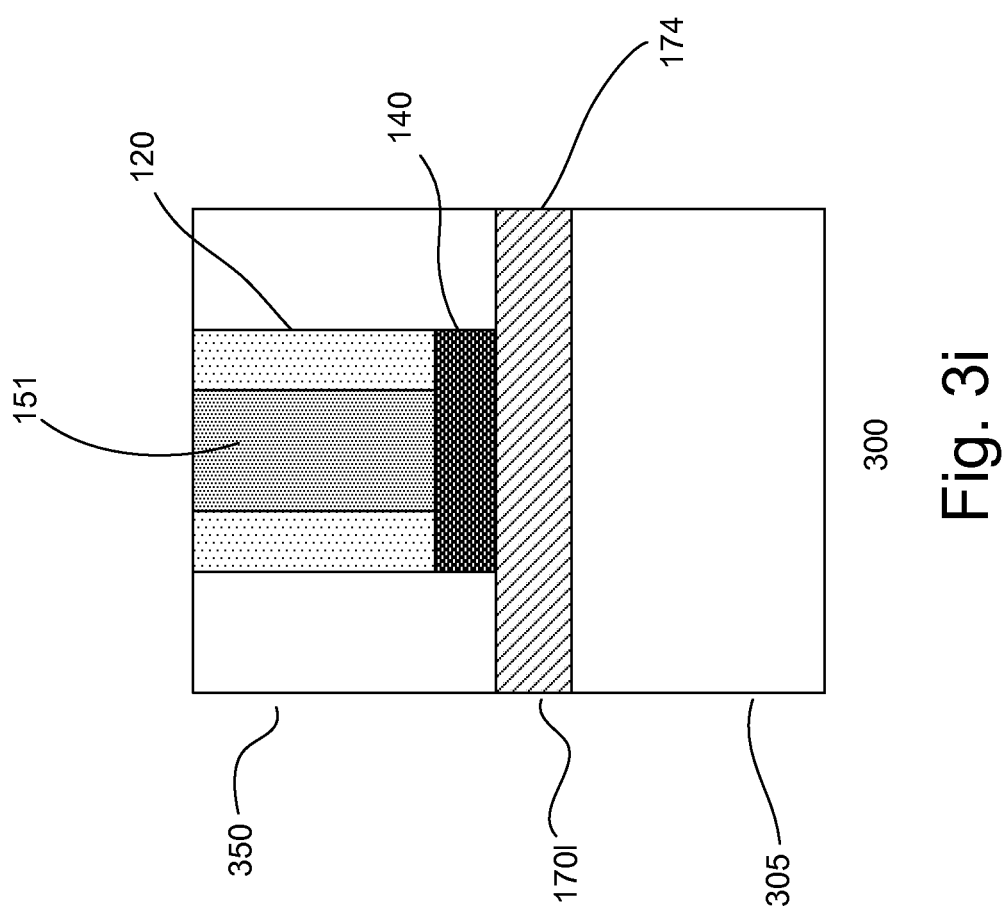

Referring to FIG. 3i, a dielectric layer is deposited on the substrate, filling the opening between the fins to form an IFD 151. The dielectric layer, for example, is deposited by CVD. Excess IFD material is removed by a planarizing process, such as CMP. Other types of planarizing processes may also be useful. The planarizing process removes the spacers and ILD material as well, forming a planar top surface between the ILD, IFD and fins.

In one embodiment, the IFD is formed of a BTC dielectric material. The IFD may be formed of the same material as the ILD. Providing IFD which is formed from a different material than the ILD may also be useful. Preferably, both the ILD and IFD layers are formed of BTC materials.

Referring to FIG. 3j, an upper electrode level 170u is formed. The upper electrode level includes an IED with top electrodes 172. The top electrodes may be conductors. The top electrodes, for example, are disposed along the x direction. The top electrodes may be formed in the IED by damascene techniques. Other techniques for forming the top electrodes, such as reactive ion etch (RIE), may also be useful.

Figure 4A:
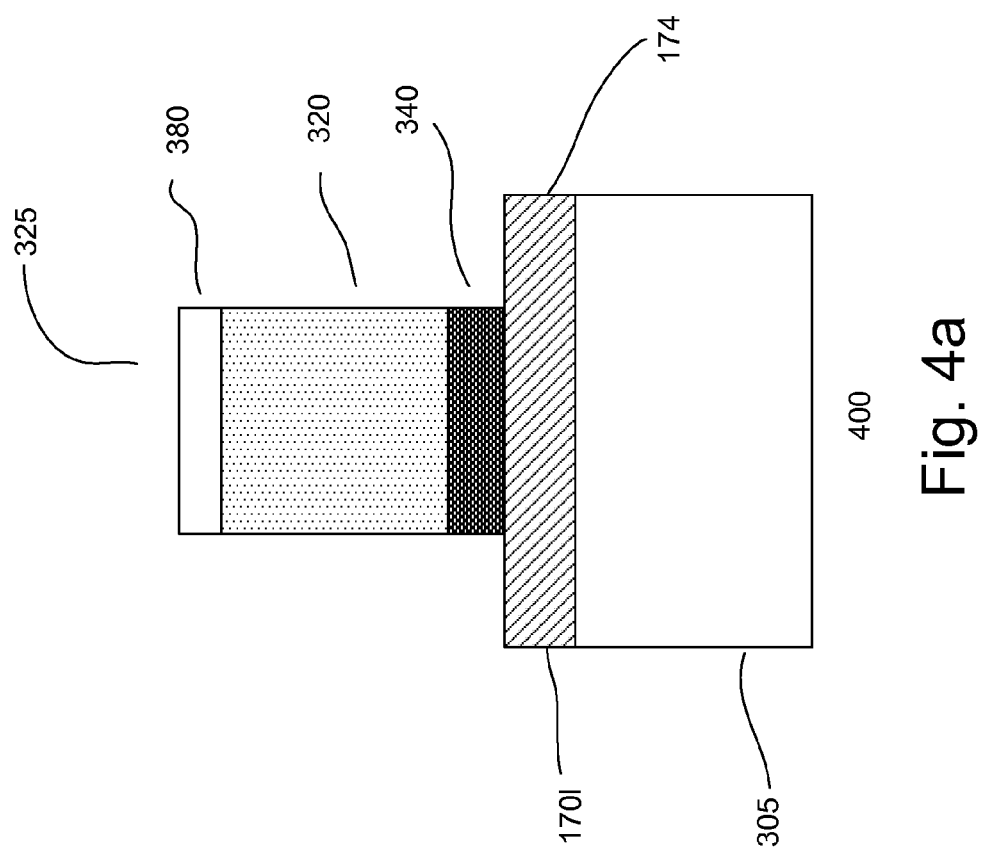
FIGS. 4a-c show cross-sectional views of a process for forming another embodiment of a device.
Figure 4B:
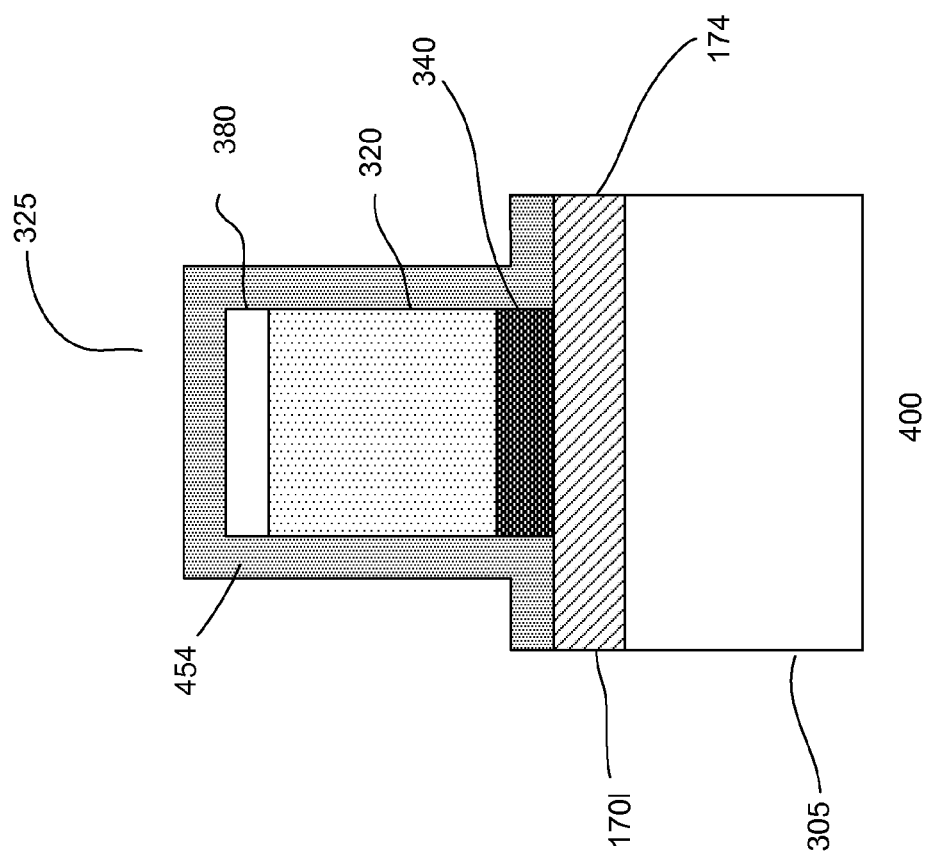
Figure 4C:
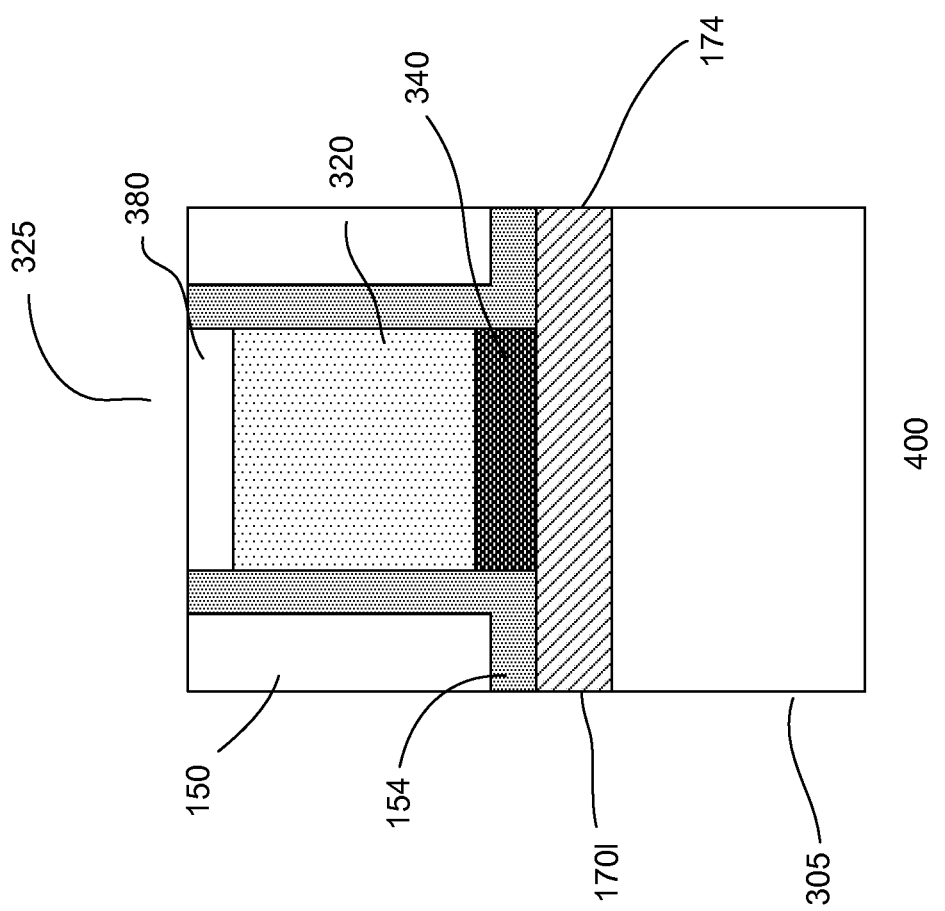

FIGS. 4a-c show cross-sectional views of a process of forming another embodiment of a device 400. The cross-sectional views are along the x direction. In one embodiment, the process is employed to form a 2 fin/cell PCRAM cell.

Referring to FIG. 4a, a partially processed device is shown. The partially processed device is at a stage of processing as described in FIG. 3c. Common elements may not be described or described in detail. For example, a substrate 305 is processed to have a fin block 325 over a lower electrode level 170l with bottom electrodes 174.

In FIG. 4b, a dielectric liner 454 is formed on the substrate. The dielectric liner is conformally formed on the substrate, lining the lower electrode level and fin block. In one embodiment, the dielectric liner may be formed by CVD. Other deposition processes may also be useful to form the liner. The liner may be a BTC liner. The thickness of the dielectric liner, for example, may be about 10-100 nm. Other thicknesses may also be useful.

Referring to FIG. 4c, a dielectric layer 150 is formed on the substrate. The dielectric layer covers the liner. In one embodiment, the dielectric layer, for example, is at least equal to a height of the fin block. The dielectric layer serves as the ILD layer of the memory cells. The dielectric layer may be formed of, for example, ILD materials used in metal levels. Alternatively, the ILD layer may be formed of a BTC dielectric material. The BTC material need not be the same as that of the liner. The dielectric layer, for example, may be formed by CVD. Other techniques, such as sputtering or ebeam, may also be useful. Excess dielectric material is removed by a planarizing process. The planarizing process, for example, may be chemical mechanical polishing (CMP). Other types of planarizing processes may also be useful. The planarizing process removes the liner on top of the fin block. This forms a planar surface between the ILD layer 150, the liner 154 and top of the hard mask 380. After the planarizing process, the process continues as described from FIG. 3d and onwards to complete forming the memory cells and device.

Figure 4D:
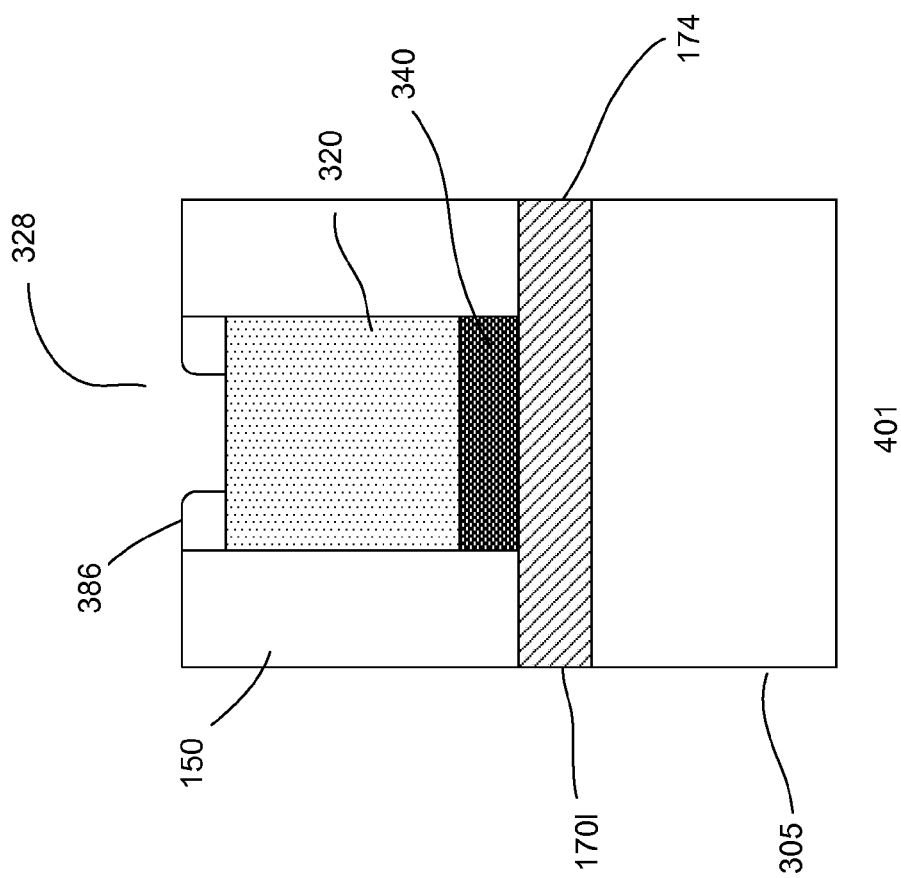
FIGS. 4d-e show cross-sectional views of a process for forming yet another embodiment of a device.
Figure 4E:
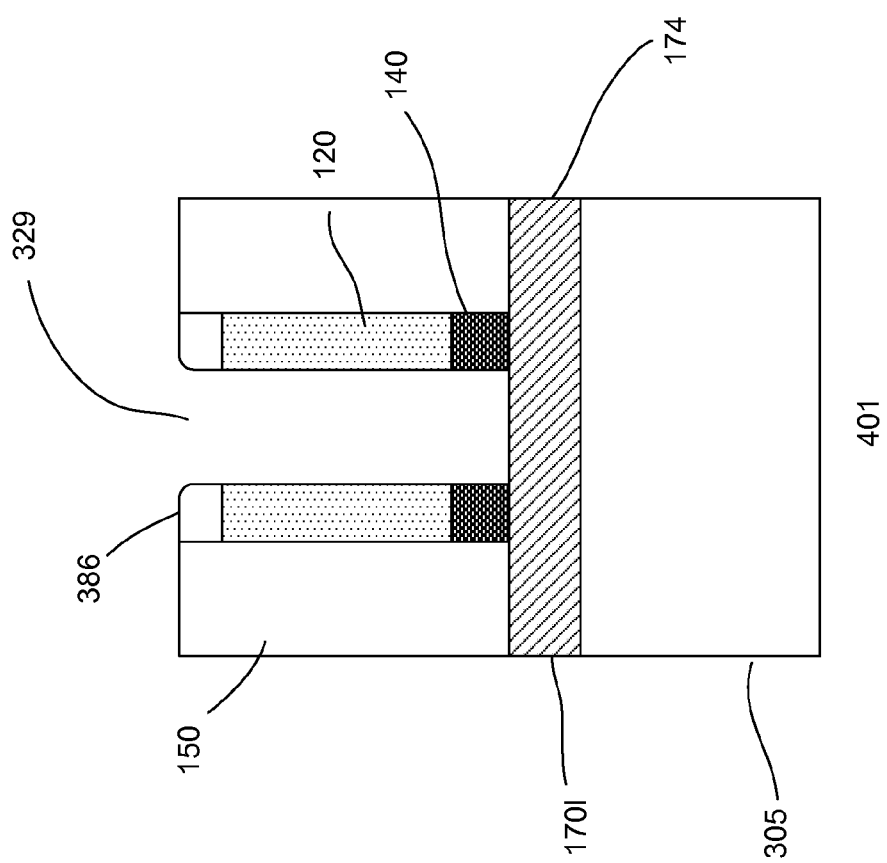

FIGS. 4d-e show cross-sectional views of a process of forming another embodiment of a device 401. The cross-sectional views are along the x direction. In one embodiment, the process is employed to form a 2 fin/cell PCRAM cell.

Referring to FIG. 4d, a partially processed device is shown. The partially processed device is at a stage of processing as described in FIG. 3g. Common elements may not be described or described in detail. For example, a substrate 305 is processed to have a fin block 325 over a lower electrode level 1701 with a bottom electrode and spacer 386 formed in the recess 328 over the fin block. The spacer preferably is patterned to define the cell area. For example, the spacer may be anisotropically etched using a patterned photoresist mask to remove two opposing sides, leaving two separate parallel spacers. In some embodiment, the spacer may remain as it is.

Referring to FIG. 4e, an anisotropic etch, such as an RIE, is performed. The etch is selective to the spacers and ILD layer. This enables the portion of the fin block unprotected by the spacers to be removed, forming first and second main fin bodies 120 with an opening 329 between them. In one embodiment, the etch also removes the HG layer below, leaving secondary fin bodies 140 coupled to the main fin bodies 120 and bottom electrodes 174.

The process continues as described from FIG. 3i and onwards to complete forming the memory cell and device. In some embodiments, the process as described in FIGS. 4a-c may be adapted to include the process of FIGS. 4d-e. For example, the process of FIGS. 4a-c can be adapted to provide each fin stack with its own secondary fin body.

FIGS. 5a-f show cross-sectional views of a process of forming another embodiment of a device 500. The cross-sectional views are along the x direction. In one embodiment, the process is employed to form a 2 fin/cell PCRAM cell.

Referring to FIG. 5a, a partially processed device is shown. The partially processed device is at a stage of processing as described in FIG. 3b. Common elements may not be described or described in detail. For example, a substrate 305 is processed to have a hard mask layer 380 disposed on top of the fin stack layers which include a fin buffer layer 340 and a fin layer 320 over a lower electrode level 1701 with bottom electrodes 174.

In FIG. 5b, the process continues to pattern the hard mask layer, leaving the patterned hard mask corresponding to the space between first and second fins which are to be formed later. The hard mask layer, for example, may be patterned using mask and etch techniques. Other techniques may also be useful.

Figure 5C:
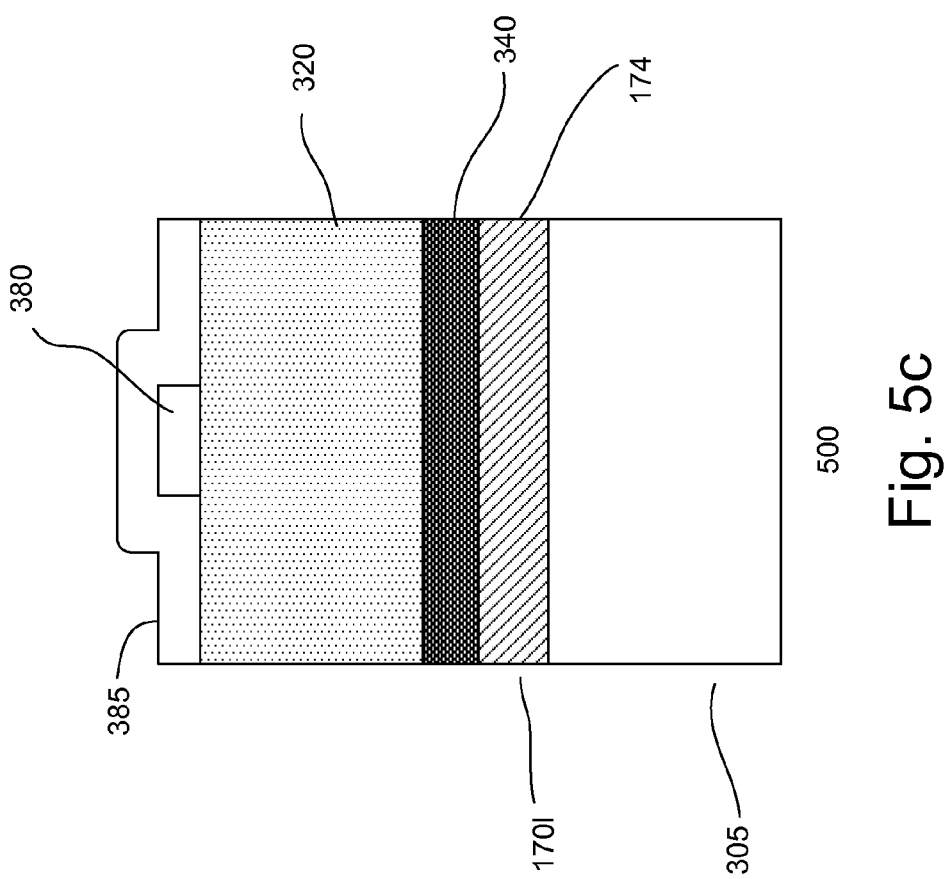

The process continues to form spacers after patterning the hard mask layer. Referring to FIG. 5c, a spacer layer 385 is formed on the substrate, covering the surface of the patterned hard mask and fin layer. The spacer layer, in one embodiment, includes oxide or nitride material. Other types of materials, including dielectric and conductive materials, which can be removed selectively to the fin and hard mask materials may also be useful. The thickness of the spacer layer is equal to about a width of the spacer to be formed. In one embodiment, the thickness of the spacer layer is selected to be equal to about a width of the fin or fin stack.

Figure 5D:
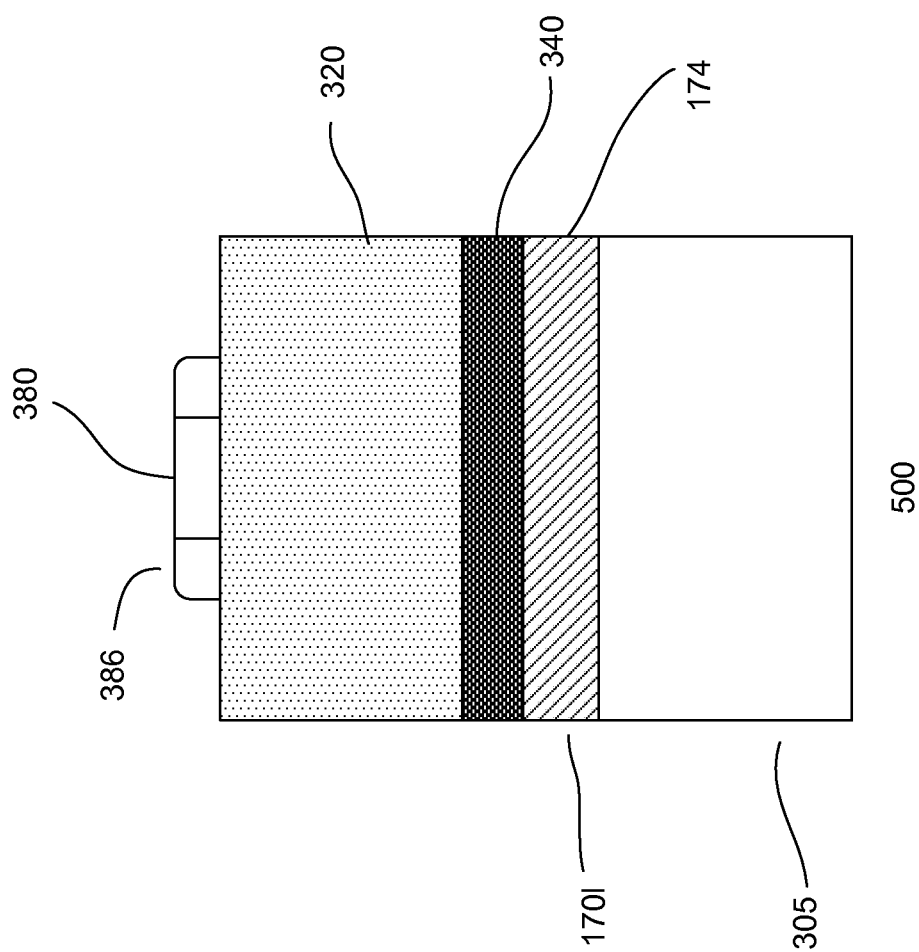

The spacer layer is patterned using an anisotropic etch, such as an RIE. The RIE removes horizontal components of the spacer layer, leaving a spacer 386 disposed adjacent to sidewalls of the patterned hard mask as shown in FIG. 5d.

Figure 5E:
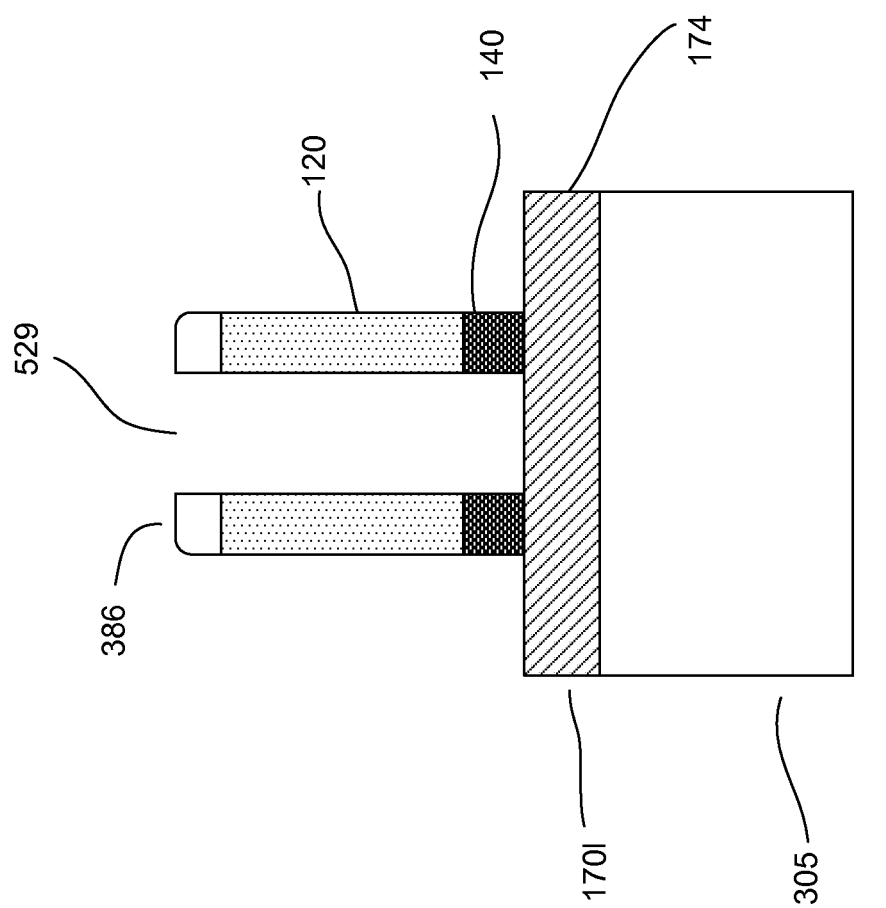

Referring to FIG. 5e, the patterned hard mask over the fin stack layers is removed. In one embodiment, the patterned hard mask is removed by a wet etch. Other techniques for removing the patterned hard mask may also be useful. Removing the hard mask forms a recess above the fin layer. The spacer preferably is patterned to define the cell area after the hard mask is removed. For example, the spacer may be anisotropically etched using a patterned photoresist mask to remove two opposing sides, leaving two separate parallel spacers. Patterning the spacer prior to removing the hard mask may also be useful. In some embodiment, the spacer may remain as it is.

As shown in FIG. 5e, an anisotropic etch, such as an RIE, is performed. The etch is selective to the spacers and the lower electrode level. This enables the portion of the fin unprotected by the spacers to be removed, forming first and second main fin bodies 120 with an opening 529 between them. In one embodiment, the etch also removes the HG layer, leaving secondary fin bodies 140 coupled to the main fin bodies 120 and bottom electrodes 174.

Figure 5F:
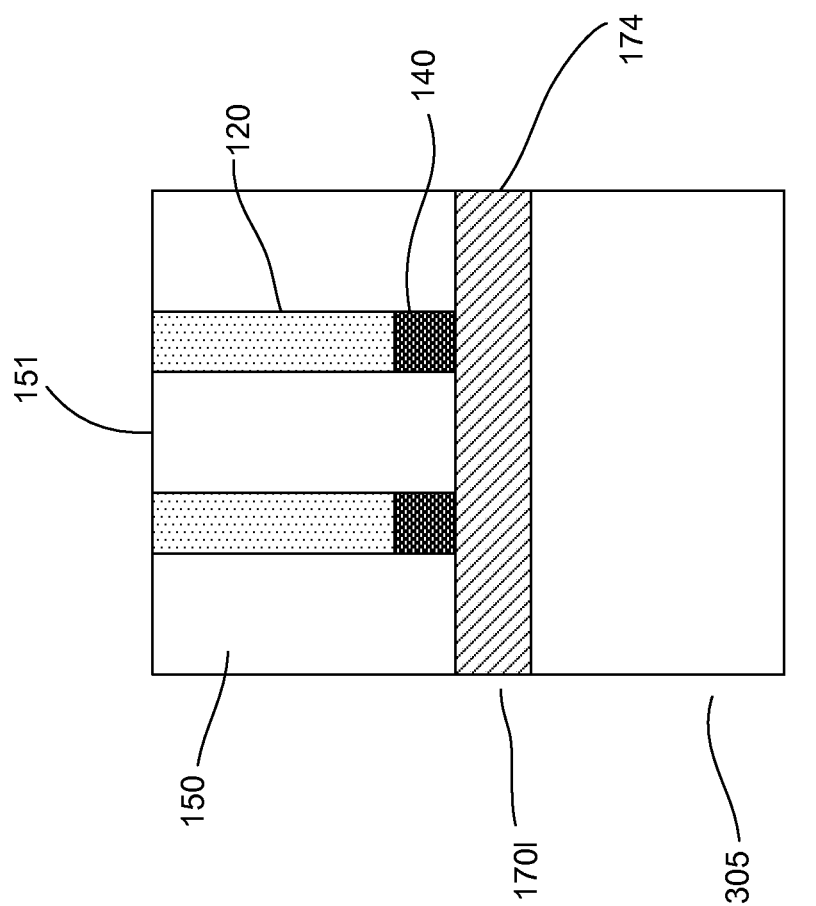

Referring to FIG. 5f, a dielectric layer 150 is deposited on the substrate. The dielectric layer fills the area around the fins. The dielectric layer may be formed of, for example, ILD materials used in metal levels. Alternatively, the ILD layer may be formed of a BTC dielectric material. The dielectric layer, for example, is deposited by CVD. Other techniques for forming the dielectric layer may also be useful.

Excess dielectric material of the dielectric layer is removed by a planarizing process, such as CMP. Other types of planarizing processes may also be useful. The planarizing process removes the spacers and excess dielectric material, forming a planar top surface with the ILD 150, IFD 151 and fins 120.

The process continues as described from FIG. 3i and onwards to complete forming the memory cells and device.

Figure 6B:
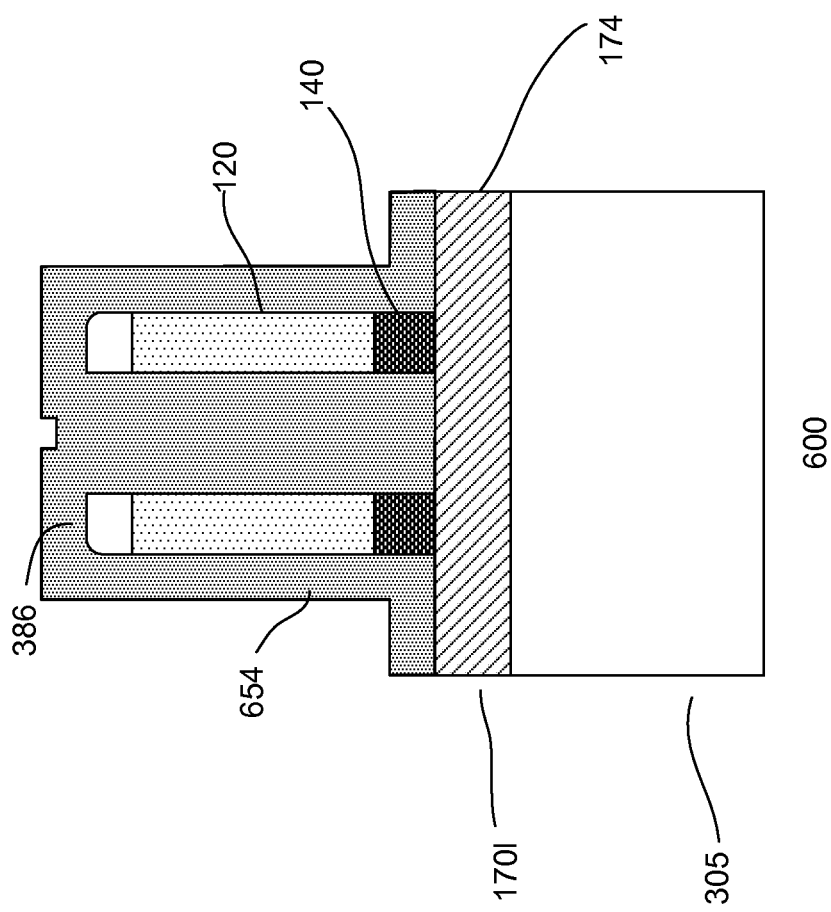
Figure 6C:
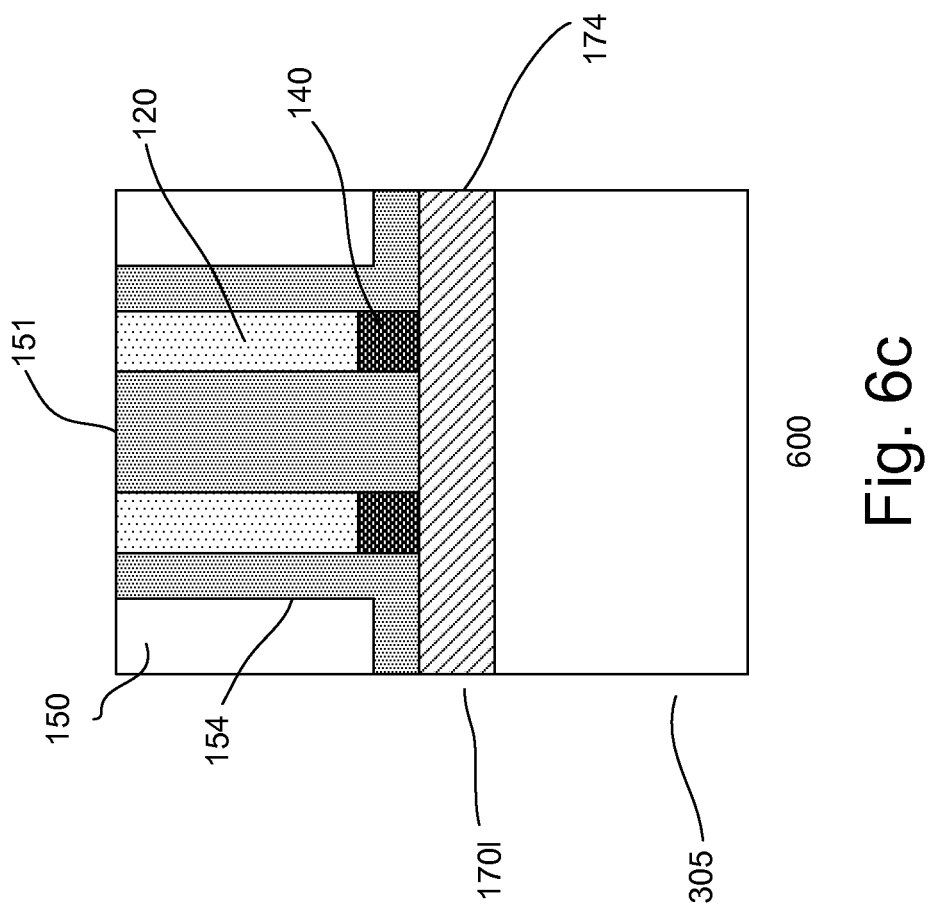

FIGS. 6a-c show cross-sectional views of a process of forming another embodiment of a device 600. The cross-sectional views are along the x direction. In one embodiment, the process is employed to form a 2 fin/cell PCRAM cell.

Referring to FIG. 6a, a partially processed device is shown. The partially processed device is at a stage of processing as described in FIG. 5e. Common elements may not be described or described in detail. For example, main fin bodies 120 with spacers 386 are disposed on a lower electrode level 1701 on a substrate 305.

As shown in FIG. 6b, a dielectric liner 654 is formed on the substrate. The dielectric liner is conformally formed on the substrate, lining the lower electrode level and fins with liner material. As shown, the liner also fills the space between the fins. In one embodiment, the dielectric liner may be formed by CVD. Other deposition processes may also be useful to form the liner. In one embodiment, the dielectric liner is a BTC liner. The thickness of the dielectric liner, for example, may be about 10-100 nm. Other thicknesses may also be useful.

Referring to FIG. 6c, a dielectric layer 150 is deposited on the substrate. The dielectric layer covers the liner and fills the area around the fins. The dielectric layer may be formed of, for example, ILD materials used in metal levels. Alternatively, the ILD layer may be formed of a BTC dielectric material. The dielectric layer, for example, is deposited by CVD. Other techniques for forming the dielectric layer may also be useful. Excess dielectric material of the dielectric layer is removed by a planarizing process, such as CMP. Other types of planarizing processes may also be useful. The planarizing process removes the spacers and excess dielectric and liner materials, forming a planar top surface with the ILD 150, IFD 151, liner 154 and fins 120. The process, for example, continues as described in FIG. 3i and onwards.

FIGS. 7a-f show cross-sectional views of another embodiment of a process of forming a device 700. Figures with a subscript 1 show cross-sectional views of the device in a first (x) direction and Figures with a subscript 2 show cross-sectional views of the device in a second (y) direction. The first and second directions are, in one embodiment, orthogonal to each other. Providing first and second directions which are configured at other angles with respect to each other may also be useful. In one embodiment, the process is employed to form 1 fin/cell PCRAM cells. The process may be similar to the process described in forming 2 fin/cell memory cells. Common elements may not be described or described in detail.

Referring to FIG. 7a, a substrate 305 is provided. The substrate, for example, is a semiconductor substrate. The substrate may include a substrate component level. The substrate component level may include circuit components, such as transistors. A dielectric layer may be provided over the substrate component level to isolate the substrate from one or more upper component levels, such as metal levels.

In one embodiment, the substrate is prepared with a lower electrode level 1701. The lower electrode level may be any component level. For example, the lower electrode level may be any metal level of the device. The lower electrode level, for example, includes bottom electrodes 174 formed in an IED level. The bottom electrodes may be island or via bottom electrodes. The island electrodes may be connected to, for example, respective selection elements (not shown). In other embodiments, the bottom electrode may be a bottom electrode conductor on a component level other than the substrate level. The bottom electrode conductors, for example, are along the second or y direction. Providing bottom electrode conductors in the first or x direction may also be useful. In some other embodiments, the lower electrode level may be the substrate component level. The bottom electrodes, for example, may be silicide contacts which may be connected to contact regions of selection elements. Dielectric material of the IED level is provided to separate the bottom electrodes.

Layers of a fin stack are formed on the lower electrode level. In one embodiment, the fin stack layers include a secondary fin body layer 340 and a main fin body layer 320. In one embodiment, the secondary fin body layer is a HG layer and the main fin body layer is a PC layer. The thicknesses of the layers are selected to be equal to about the height of the secondary and main fin bodies. As shown, the secondary fin body layer is disposed below the main fin body layer. Alternatively, the secondary fin body layer is disposed above the main fin body layer.

A hard mask layer 380 is disposed on top of the fin stack layers. In one embodiment, the hard mask is formed of a material which can be etched selectively with respect to the spacer. For example, in the case where the spacer is nitride, the hard mask may be formed of silicon oxide or tantalum nitride (TaN). Other suitable types of hard mask material may also be useful. The thickness of the hard mask, for example, may be about 10-100 nm. Other thicknesses may also be useful. The various layers may be formed by chemical vapor deposition (CVD). Other processes, such as sputtering, ebeam and PVD, may also be useful. The process, for example, may depend on the type of layer to be formed.

As shown in FIG. 7b, the hard mask is patterned using, for example, mask and etch techniques. For example, a soft mask layer, such as photoresist is patterned, exposing it with an exposure source through a reticle using a lithographic system. The exposed soft mask layer is developed, transferring the pattern of the reticle to the resist. The patterned soft mask exposes portions of the underlying hard mask layer. The patterned soft mask is used to pattern the hard mask layer. For example, an anisotropic etch, such as an RIE is used to remove exposed portions of the hard mask layer. This transfers the pattern of the soft mask to the hard mask layer. The pattern of the hard mask, for example, substantially corresponds to non-fin areas.

A spacer 386 is formed on sidewalls of the hard mask. The spacer may be formed by depositing a spacer layer on the substrate and anisotropically etching it. The hard mask is removed, as shown in FIG. 7c, leaving spacers on the top of the fin stack. The hard mask may be removed by an anisotropic etch selective to the fin stack and spacers. Other techniques may also be useful to remove the hard mask.

The process continues to define the cell areas for 1 fin/cell memory cells. The cell area definition is achieved by patterning the spacer. The spacer, for example, is patterned using an anisotropic etch with an etch mask. Portions of the spacer are removed, leaving spacers corresponding to cell areas.

As shown in FIG. 7d, an anisotropic etch, such as an RIE, is performed. The etch is selective to the spacers, removing layers of the fin stack. This enables the portion of the fin stack unprotected by the spacers to be removed, forming fins 110 of memory cells with main and secondary fin bodies 120 and 140. In one embodiment, a fin is in communication with a bottom electrode. As shown, a fin has a width in the first (x) direction and a length in the second (y) direction.

Referring to FIG. 7e, a dielectric layer 151 is deposited on the substrate, filling the spaces between fins. The dielectric layer, for example, may be an ILD layer. In one embodiment, the dielectric layer includes a BTC material. Other types of dielectric materials may also be useful. The dielectric layer, for example, is deposited by CVD. Excess ILD material is removed by a planarizing process, such as CMP. Other types of planarizing processes may also be useful. The planarizing process removes the spacers and ILD material as well, forming a planar top surface between the ILD 150 and fins.

In an alternative embodiment, a dielectric liner (not shown) may be formed prior to forming the ILD layer. The dielectric liner may line the fins. Depending on the gap between fins, the dielectric liner may fill and/or not fill the space between fins. The dielectric liner, for example, includes a BTC material. Thereafter, the dielectric layer may be formed on the liner, filling any remaining spaces between fins. Excess dielectric material is removed by a planarizing process, such as CMP. Other types of planarizing processes may also be useful. The planarizing process removes the spacers and liner material as well, forming a planar top surface between the dielectric layer 150, liner and fins.

Referring to FIG. 7f, an upper electrode level 170u is formed. The upper electrode level includes an IED with top electrodes 172. The top electrodes, in one embodiment, may be conductors. The top electrodes, for example, are disposed along the x direction. The top electrodes may be formed in the IED by damascene techniques. Other techniques for forming the top electrodes, such as reactive ion etch (RIE), may also be useful.

In some embodiments, the processes described in FIGS. 3a-j and FIGS. 4a-e can be adapted to form 1 fin/cell PCRAM cells. For example, the bottom electrodes layer may be adapted as to the process described in FIGS. 7a-f and, where applicable, each fin is provided with its own secondary fin body.

In other embodiments, the processes of FIGS. 3a-j, 4a-c, 4d-e, 5a-f, 6a-c and 7a-f may be adapted to form a RRAM cell. To form a RRAM cell, similar or same processes may be used. Some layers may be replaced with appropriate materials to form the RRAM cell instead of PCRAM cell. For example, the main fin body layer is formed of a PR material, the secondary fin body layer is formed of an electrode or PR material, the ILD layer, IFD and dielectric liner may be formed of dielectric materials used in metal levels of an IC. In some embodiments, no secondary fin body layer may be included in the fin stack.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
    providing a substrate prepared with a lower electrode level with at least one bottom electrode;
    forming fin stack layers on the lower electrode level, wherein the fin stack layers comprise a secondary fin body layer and a main fin body layer formed over and contacts the secondary fin body layer and the secondary fin body layer contacts the at lest one bottom electrode;
    forming spacers on top of and directly contacting a top surface of the main fin body layer, wherein the spacers have a width which is less than a lithographic resolution;
    patterning at least the main fin body layer using the spacers as a mask to form individual fin stacks;
    removing the spacers after patterning at least the main fin body layer;
    forming an interlevel dielectric (ILD) layer on the substrate, filling spaces around the fin stacks; and
    forming an upper electrode level on the ILD layer after removing the spacers, the upper electrode level having at least one top electrode in contact with the fin stacks, the electrodes and fin stacks form one or more fin-type memory cells.

2. The method of claim 1 comprises forming dielectric liner lining sides of the fin stacks and top of the lower electrode level.

3. The method of claim 1 wherein forming the spacers comprises:
    forming a hard mask over the fin stack layers;
    patterning the hard mask; and
    forming the spacers on sides of the hard mask.

4. The method of claim 3 wherein patterning at least the main fin body layer using the spacers form at least first and second fin stacks.

5. The method of claim 4 comprises forming a dielectric liner on the substrate lining sides of the fin stacks and top of the lower electrode level.

6. The method of claim 5 wherein the dielectric liner fills a space between the first and second fin stacks.

7. The method of claim 6 wherein:
    the ILD layer is formed over the substrate covering the dielectric liner; and
    removing excess material to provide a planar top surface between the ILD layer, liner and top of the fin stacks.

8. The method of claim 1 wherein forming the spacers comprises:
    forming a hard mask over the fin stack layers;
    patterning the hard mask and fin stack layers to form an initial fin stack;
    forming a fill dielectric on the substrate filling spaces around the initial fin stack, the fill dielectric having a planar top surface with the top of the hard mask over the fin stack layers;
    removing the hard mask to expose a top of the fin stack layers of the initial fin stack and sides of the fill dielectric;
    forming the spacers on sides of the fill dielectric layer on the top of the fin stack layer.

9. The method of claim 8 wherein patterning at least the main fin body layer comprises patterning the initial fin stack using the spacers to form at least first and second fin stacks.

10. The method of claim 9 further comprises:
    filling the space between the fin stacks after patterning the initial fin stack with an interfin dielectric (IFD) layer; and
    removing excess material to form a planar top surface between the fill dielectric layer, top of the fin stacks and IFD layer.

11. The method of claim 9 comprises:
    removing the fill dielectric layer after patterning the initial fin stack;
    forming a dielectric liner lining sides of the first and second fin stacks and a top of the lower electrode layer.

12. The method of claim 11 wherein:
    the ILD layer is formed on the substrate over the dielectric liner; and
    excess materials are removed to form a planar surface between the ILD layer, dielectric liner and top of the fin stacks.

13. The method of claim 11 wherein the dielectric liner fills a space between the first and second fin stacks to form an interfin dielectric (IFD) layer.

14. The method of claim 13 wherein:
    the ILD layer is formed on the substrate over the dielectric liner; and
    excess materials are removed to form a planar surface between the ILD layer, the dielectric liner, the IFD layer and top of the fin stacks.

15. The method of claim 1 wherein the fin stack layers comprises fin stack layers of a phase change random access memory (PCRAM).

16. The method of claim 1 wherein the fin stack layers comprises fin stack layers of a resistive random access memory (RRAM).

17. The method of claim 1 wherein the memory cells are 1 fin/cell memory cells.

18. The method of claim 1 wherein the memory cell is a 2 fin/cell memory cell.

19. A method of forming a device comprising:
    providing a substrate prepared with a lower electrode level with a bottom electrode;
    forming layers of a fin stack on the lower electrode level, wherein the fin stack layers comprise a secondary fin body layer and a main fin body layer formed over and contacts the secondary fin body layer and the secondary fin body layer contacts the at least one bottom electrode;
    forming a spacer on top of and directly contacting a top surface of main fin body layer, wherein the spacer has a width which is less than a lithographic resolution;
    patterning at least the main fin body layer using the spacer as a mask to form a fin stack;
    removing the spacers after patterning at least the main fin body layer;
    forming an interlevel dielectric (ILD) layer on the substrate, filling spaces around the fin stack; and
    forming an upper electrode level on the ILD layer after removing the spacers, the upper electrode level having a top electrode in contact with the fin stack, the electrodes and fin stack form a fin-type memory cell.

20. The method of claim 19 wherein forming the spacer comprises:

forming a hard mask over the fin stack;

patterning the hard mask and fin stack to form an initial fin stack;

forming a fill dielectric on the substrate filling spaces around the initial fin stack, the fill dielectric having a planar top surface with the top of the hard mask over the fin stack;

removing the hard mask to expose a top of the fin stack of the initial fin stack and sides of the fill dielectric; and forming the spacer on a side of the fill dielectric layer on the top of the fin stack.

21. A method of forming a device comprising:

providing a substrate prepared with a lower electrode level with at least one bottom electrode;

forming fin stack layers on the lower electrode level, wherein the fin stack layers comprise a secondary fin body layer and a main fin body layer formed over the secondary fin body layer;

forming spacers on top of the fin stack layers, wherein the spacers have a width which is less than a lithographic resolution;

patterning at least one of the layers of the fin stack layers using the spacers as a mask to form fins, wherein the secondary fin body layer is a common secondary fin body contacting the at least one bottom electrode;

forming an interlevel dielectric (ILD) layer on the substrate, filling spaces around the fin stacks; and forming an upper electrode level on the ILD layer, the upper electrode level having at least one top electrode in contact with the fin stacks, the electrodes and fin stacks form one or more fin-type memory cells.

* * * * *